US007673262B2

(12) United States Patent
Stine et al.

(10) Patent No.: US 7,673,262 B2
(45) Date of Patent: *Mar. 2, 2010

(54) SYSTEM AND METHOD FOR PRODUCT YIELD PREDICTION

(75) Inventors: Brian E. Stine, Los Altos Hills, CA (US); Christopher Hess, San Ramon, CA (US); John Kibarian, Los Altos Hills, CA (US); Kimon Michaels, San Jose, CA (US); Joseph C. Davis, Allen, TX (US); Purnendu K. Mozumder, Plano, TX (US); Sherry F. Lee, San Jose, CA (US); Larg H. Weiland, San Ramon, CA (US); Dennis J. Ciplickas, San Jose, CA (US); David M. Stashower, Los Gatos, CA (US)

(73) Assignee: PDF Solutions, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/119,862

(22) Filed: May 13, 2008

(65) Prior Publication Data
US 2008/0282210 A1 Nov. 13, 2008

Related U.S. Application Data

(63) Continuation of application No. 11/503,433, filed on Aug. 10, 2006, now Pat. No. 7,373,625, which is a continuation of application No. 11/078,630, filed on Mar. 10, 2005, now Pat. No. 7,174,521, which is a continuation of application No. 10/200,045, filed on Jul. 18, 2002, now Pat. No. 6,901,564, which is a continuation of application No. 09/442,699, filed on Nov. 18, 1999, now Pat. No. 6,449,749.

(51) Int. Cl.
*G06F 17/50* (2006.01)
(52) U.S. Cl. .......................................... 716/4; 716/21

(58) Field of Classification Search ...................... None
See application file for complete search history.

(56) References Cited

U.S. PATENT DOCUMENTS 3,751,647 A 8/1973 Maeder et al.

(Continued)

FOREIGN PATENT DOCUMENTS

CN 1097829 1/1995

OTHER PUBLICATIONS

Wong, "A Statistical Parametric and Probe Yield Analysis Methodology," 1996 Int'l Symposium on Defect and Fault Tolerance in VLSI Systems, pp. 131-139.

(Continued)

*Primary Examiner*—Leigh Marie Garbowski
(74) *Attorney, Agent, or Firm*—Cantor Colburn LLP

(57) ABSTRACT

A system and method for predicting yield of integrated circuits includes at least one type of characterization vehicle which incorporates at least one feature which is representative of at least one type of feature to be incorporated in the final integrated circuit product. The characterization vehicle is subjected to at least one of the process operations making up the fabrication cycle to be used in fabricating the integrated circuit product in order to produce a yield model. The yield model embodies a layout as defined by the characterization vehicle and preferably includes features which facilitate the gathering of electrical test data and testing of prototype sections at operating speeds. An extraction engine extracts predetermined layout attributes from a proposed product layout. Operating on the yield model, the extraction engine produces yield predictions as a function of layout attributes and broken down by layers or steps in the fabrication process. These yield predictions are then used to determine which areas in the fabrication process require the most improvement.

20 Claims, 14 Drawing Sheets

U.S. PATENT DOCUMENTS

| | | | |
|---|---|---|---|
| 4,795,964 | A | 1/1989 | Mahant-Shetti et al. |
| 4,835,466 | A | 5/1989 | Maly et al. |
| 4,939,681 | A | 7/1990 | Yokomizo et al. |
| 5,067,101 | A | 11/1991 | Kunikiyo et al. |
| 5,068,547 | A | 11/1991 | Gascoyne |
| 5,070,469 | A | 12/1991 | Kunikiyo et al. |
| 5,286,656 | A | 2/1994 | Keown et al. |
| 5,301,118 | A | 4/1994 | Heck et al. |
| 5,438,527 | A | 8/1995 | Feldbaumer et al. |
| 5,448,476 | A | 9/1995 | Kurokawa et al. |
| 5,486,786 | A | 1/1996 | Lee |
| 5,497,381 | A | 3/1996 | O'Donoghue et al. |
| 5,502,643 | A | 3/1996 | Fujinaga et al. |
| 5,625,268 | A | 4/1997 | Miyanari et al. |
| 5,627,083 | A | 5/1997 | Tounai et al. |
| 5,629,877 | A | 5/1997 | Tamegaya et al. |
| 5,655,110 | A | 8/1997 | Krivokapic et al. |
| 5,703,381 | A | 12/1997 | Iwasa et al. |
| 5,767,542 | A | 6/1998 | Nakamura |
| 5,773,315 | A | 6/1998 | Jarvis |
| 5,778,202 | A | 7/1998 | Kuroishi et al. |
| 5,790,479 | A | 8/1998 | Conn |
| 5,798,649 | A | 8/1998 | Smayling et al. |
| 5,822,258 | A | 10/1998 | Casper |
| 5,852,581 | A | 12/1998 | Beffa et al. |
| 5,867,033 | A | 2/1999 | Sporck et al. |
| 5,903,012 | A | 5/1999 | Boerstler |
| 5,966,527 | A | 10/1999 | Krivokapic et al. |
| 5,982,929 | A | 11/1999 | Ilan et al. |
| 6,005,829 | A | 12/1999 | Conn |
| 6,063,132 | A | 5/2000 | DeCamp et al. |
| 6,066,179 | A | 5/2000 | Allan et al. |
| 6,072,804 | A | 6/2000 | Beyers, Jr. |
| 6,075,417 | A | 6/2000 | Cheek et al. |
| 6,075,418 | A | 6/2000 | Kingsley et al. |
| 6,118,137 | A | 9/2000 | Fulford, Jr. et al. |
| 6,124,143 | A | 9/2000 | Sugasawara |
| 6,134,191 | A | 10/2000 | Alfke |
| 6,184,048 | B1 | 2/2001 | Ramon |
| 6,289,257 | B1 | 9/2001 | Sekine et al. |
| 6,393,602 | B1 | 5/2002 | Atchison et al. |
| 6,449,749 | B1 | 9/2002 | Stine |
| 6,526,547 | B2 | 2/2003 | Breiner et al. |
| 6,901,564 | B2 | 5/2005 | Stine et al. |
| 7,174,521 | B2 | 2/2007 | Stine et al. |
| 2006/0277506 | A1 | 12/2006 | Stine et al. |

OTHER PUBLICATIONS

Wong, "A Statistical Approach to Identify Semiconductor Process Equipment Related Yield Problems," 1997 IEEE Int'l Symposium on Defect and Fault Tolerance in VLSI Systems, pp. 69-73.

Wong, "A Systematic Approach to Identify Critical Yield Sensitive Parametric Parameters," 1997 2nd Int'l Workshop on Statistical Metrology, pp. 56-61.

Khare et al., Extraction of Defect Characteristics for Yield Estimation Using the Double Bride Test Structure: VLSITSA, pp. 428-432, 1991.

Khare et al., "Yield Oriented Computer-Aided Design Defect Diagnosis", IEEE Trans on Semiconductor Manufacturing, vol. 8, No. 2, pp. 195-206, May 1995.

Nurami et al., "In-Line Yield Prediction Methodologies Using Patterned Water Inspection-Information", IEEE Trans. of Semiconductor Manufacturing, vol. 11, No. 1, pp. 40-47, Feb. 1998.

Khare et al., "Extraction of Defect Characteristics for Yield Estimation Using the Double Bridge Test Structure", IEEE, May 1991, pp. 428-432.

Yun et al., "Evaluating the Manufacturability of FaAs/AlGaAs Multiple Quantum Well Avalanche Photodiodes Using Neural Networks", IEEE, Oct. 1997, pp. 105-112.

Hansen et al., "Effectiveness of Yield-Estimation and Reliability-Prediction Based on Wafer Test-Chip Measurements", IEEE, Jan, 1997, pp. 142-148.

Walton et al., "A Novel Approach for Reducing the Area Occupied by Contact Pads on Process Control Chips", Proc. IEEE 1990 Int. Conference on Microelectronic Test Structures, vol. 9, Mar. 1990, pp. 75-80.

Beckers and Hilltop, "The Spidermask: A New Approach For Yield Monitoring Using Product Adaptable Tet Structures", Proc. IEEE 1990 Int. Conference on Microelectronic Test Structures vol. 8, Mar. 1990, pp. 61-66.

Liebman et al., "Understanding Across Chip Line Width Variation: The First Step Toward Optical Proximity Correction", SPIE vol. 3051, pp. 124-136.

Khare et al., "Yield-Oriented Computer-Aided Defect Diagnosis", IEEE Trans. on Semiconductor Manufacturing, vol. 8, No. 2, May 1995, pp. 195-206.

To and Ismail, "Mismatch Modeling and Characterization of Bipolar Transistors for Statistical CAD", IEEE Trans on Circuits and systems-I: Fundamental Theory and Applications, vol. 43, No. 7, Jul. 1996, pp. 608-610.

Conti et al., "Parametric Yield Formulation of MOS IC's Affected by Mismatch Effect", IEEE Trans. on Computer-Aided Design of Integrated Circuits and Systems, vol. 18, No. 5, May 1999, pp. 582-596.

Michael et al., "A Flexible Statistical Model for CAD of Submicrometer Analog CMOS Integrated Circuits", Computer Aided Design 1993 IEEE/ACM Intern. Conf. on Computer Aided Design, Nov. 1993, pp. 330-333.

Felt et al., Measurement and Modeling of MOS Transistor Current mismatch in Analog ICC's, 1994 IEEE/ACM Intern. Conf. on Computer Aided Design, Nov. 1994, pp. 272-277.

Ogrenci et al., "Incorporating MOS Transistor Mismatches into Training of Analog Neural networks", Proceedings of NC Inernational ICSC/IFAC Symposium on Neural Computation, Sep. 1998, Abstract, no pg.

Henry, Todd, "Application of ADC Techniques to Characterize Yield-Limiting Defects Identified with the Overlay of E-Test/Inspection Data on Short Loop Process Testers," Advanced Semiconductor Manufacturing Conference and Workshop 1999 IEEE/SEMI, Boston, MA, Sep. 8-10, 1999, pp. 330-337.

Hsieh, Sunnys et al., "Novel Assessment of Process Control Monitor in Advanced Semiconductor Manufacturing: A Complete Set of Addressable Failure Site Test Structures (AFS-TS)," Semiconductor Manufacturing Conference Proceedings, 1999 IEEE International Symposium on, Santa Clara, CA, Oct. 11-13, 1999, pp. 241-244.

Milor, Linda et al., "Layer Yield Estimation Based on Critical Area and Electrical Defect Monitor Data," Semiconductor Manufacturing Conference Proceedings, 1999 IEEE International Symposium on, Santa Clara, CA, Oct. 11-13, 1999, pp. 99-102.

European Search Report mailed Apr. 26, 2006, for EP Application No. 0098049037 filed Nov. 17, 2000, 3 pages.

Guldi, R. et al. (Sep. 23-25, 1998). "Analysis and Modeling of Systematic and Defect Related Yield Issues During Early Development of a New Technology," IEEE/SEMI Advanced Semiconductor Manufacturing Conference and Workshop, pp. 7-12.

International Search Report mailed Sep. 11, 2003, for PCT Application No. PCT/US00/31665 filed Nov. 17, 2000, 1 page.

Nemoto, K. et al. (Sep. 8-10, 1999). "A Systematic Yield Ramp Methodology," IEEE/SEMI Advanced Semiconductor Manufacturing Conference and Workshop, Boston, MA, pp. 21-24.

Wong, K. (Sep. 23-25, 1998). Development of New Methodology and Technique to Accelerate Region Yield Improvement,: IEEE/SEMI Advanced Semiconductor Manufacturing Conference and Workshop, pp. 82-85.

Wong et al., "Micro Yield Modeling for IC Processes," 1995 IEEE Region 10 Int'l Conference on Microelectronics and VLSI, pp. 230-233.

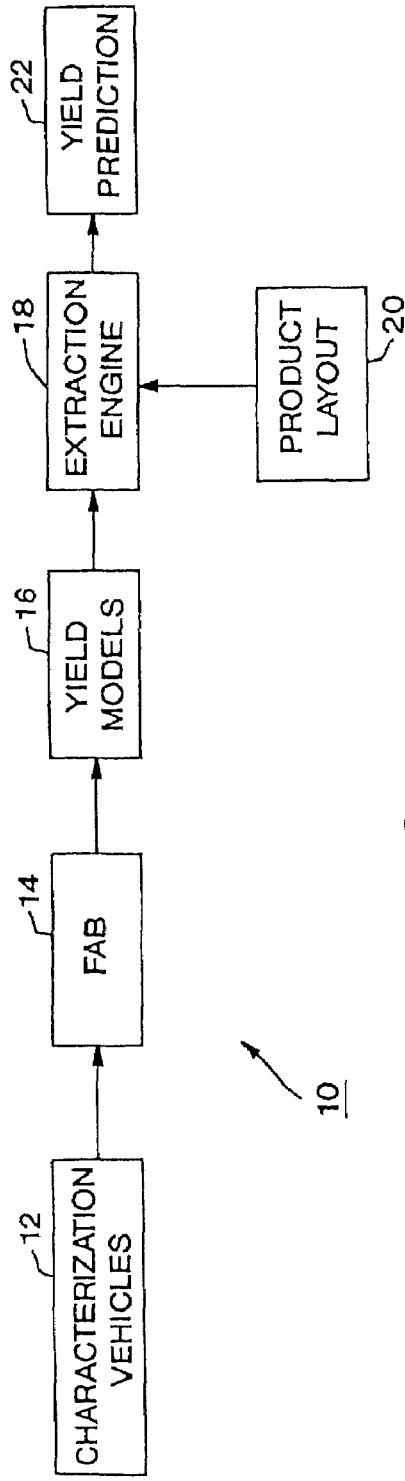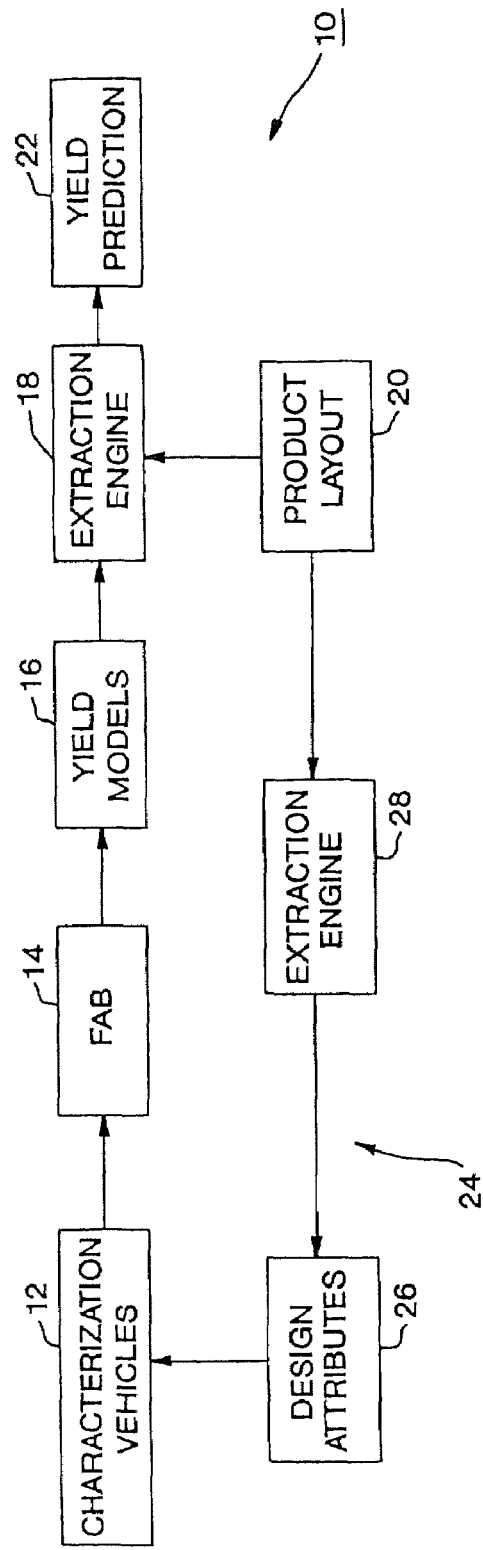

| 1 | 17 |
| 2 | 18 |
| 3 | 19 |
| 4 | 20 |
| 5 | 21 |
| 6 | 22 |
| 7 | 23 |
| 8 | 24 |
| 9 | 25 |
| 10 | 26 |
| 11 | 27 |
| 12 | 28 |
| 13 | 29 |
| 14 | 30 |
| 15 | 31 |
| 16 | 32 |
FIG. 5
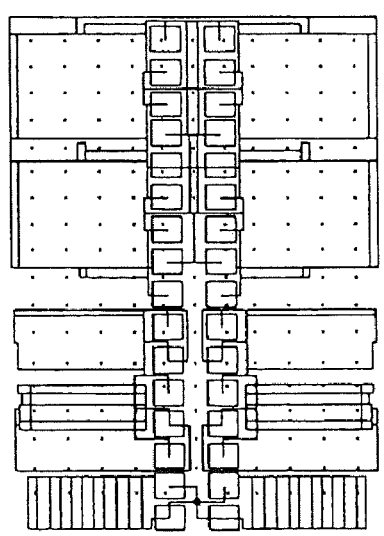
FIG. 6A
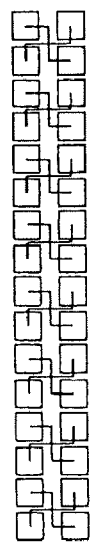
FIG. 6B

SYSTEM AND METHOD FOR PRODUCT YIELD PREDICTION

CROSS-REFERENCE TO RELATED APPLICATIONS

This application is a continuation of U.S. patent application Ser. No. 11/503,433 filed on Aug. 10, 2006, entitled SYSTEM AND METHOD FOR PRODUCT YIELD PREDICTION, now U.S. Pat. No. 7,373,625, which is a continuation of U.S. patent application Ser. No. 11/078,630, filed on Mar. 10, 2005, now U.S. Pat. No. 7,174,521, which is a continuation of U.S. patent application Ser. No. 10/200,045, filed on Jul. 18, 2002, now U.S. Pat. No. 6,901,564, which is a continuation of U.S. patent application Ser. No. 09/442,699, filed on Nov. 18, 1999, now U.S. Pat. No. 6,449,749, the entire contents of which are incorporated herein by reference.

BACKGROUND OF THE INVENTION

The present invention pertains to fabrication of integrated circuits and more particularly to systems and methods for improving fabrication yields.

The fabrication of integrated circuits is an extremely complex process that may involve hundreds of individual operations. Basically, the process includes the diffusion of precisely predetermined amounts of dopant material into precisely predetermined areas of a silicon wafer to produce active devices such as transistors. This is typically done by forming a layer of silicon dioxide on the wafer, then utilizing a photomask and photoresist to define a pattern of areas into which diffusion is to occur through a silicon dioxide mask. Openings are then etched through the silicon dioxide layer to define the pattern of precisely sized and located openings through which diffusion will take place. After a predetermined number of such diffusion operations have been carried out to produce the desired number of transistors in the wafer, they are interconnected as required by interconnection lines. These interconnection lines, or interconnects as they are also known, are typically formed by deposition of an electrically conductive material which is defined into the desired interconnect pattern by a photomask, photoresist and etching process. A typical completed integrated circuit may have millions of transistors contained with a 0.1 inch by 0.1 inch silicon chip and interconnects of submicron dimensions.

In view of the device and interconnect densities required in present day integrated circuits, it is imperative that the manufacturing processes be carried out with utmost precision and in a way that minimizes defects. For reliable operation, the electrical characteristics of the circuits must be kept within carefully controlled limits, which implies a high degree of control over the myriad of operations and fabrication processes. For example, in the photoresist and photomask operations, the presence of contaminants such as dust, minute scratches and other imperfections in the patterns on the photomasks can produce defective patterns on the semiconductor wafers, resulting in defective integrated circuits. Further, defects can be introduced in the circuits during the diffusion operations themselves. Defective circuits may be identified both by visual inspection under high magnification and by electrical tests. Once defective integrated circuits have been identified, it is desired to take steps to decrease the number of defective integrated circuits produced in the manufacturing process, thus increasing the yield of the integrated circuits meeting specifications.

In the past, many of the defects which caused poor yield in integrated circuits were caused by particulate contaminants or other random sources. Increasingly, many of the defects seen in modern integrated circuit processes are not sourced from particulates or random contaminants, especially in the earlier stages of process development or yield ramping, but rather stem from very systematic sources. Examples of these systematic defect sources include printability problems from using aggressive lithography tools, poly stringers from poorly formed silicides, gate length variation from density driven and optical proximity effects.

In attempting to decrease the number of defective integrated circuits produced in the manufacturing process, thus increasing the yield, one is faced with the fact that any one or more of possibly several hundred processing steps may have caused a particular circuit to be defective. With such a large number of variables to work with, it can be extremely difficult to determine the exact cause or causes of the defect or defects in a particular circuit thereby making it extraordinarily difficult to identify and correct the yield detracting process operations. Detailed inspection of the completed integrated circuits may provide some indication of which process operation may have caused the circuits to be defective. However, inspection equipment often does not capture many of the systematic defect sources and/or the tools can be difficult to tune, optimize, or use effectively and reliably. Furthermore, inspection equipment, especially in recent technologies is often plagued with many false alarms or nuisance defects, as they are known, which serve to frustrate any attempts to reliably observe true defects or sources of defects.

It is typically discovered that, once a particular problem has been identified at final test after completion of the fabrication cycle, it can be confirmed that a problem in a particular process operation did exist at the time that operation was carried out, which could have been weeks or even months earlier. Thus the problem might be corrected well after the fact. At this time, different process operations may be causing problems. Thus, after the fact analysis of defective integrated circuits and identification of process operations causing these defective products is severely limited as a means for improving the overall yield of integrated circuits.

A number of attempts to predict yields instead of conducting unsatisfactory after the fact analysis have been made with varying degrees of success. Thus, there is a need for an improved system and method for integrated circuit product yield prediction.

SUMMARY OF THE INVENTION

A system and method for predicting yield of integrated circuits includes at least one type of characterization vehicle which incorporates at least one feature which is representative of at least one type of feature to be incorporated in the final integrated circuit product. The characterization vehicle is subjected to at least one of the process operations making up the fabrication cycle to be used in fabricating the integrated circuit product in order to produce a yield model. The yield model embodies a layout as defined by the characterization vehicle and preferably includes features which facilitate the gathering of electrical test data and testing of prototype sections at operating speeds. An extraction engine extracts predetermined layout attributes from a proposed product layout. Operating on the yield model, the extraction engine produces yield predictions as a function of layout attributes and broken down by layers or steps in the fabrication process. These yield predictions are then used to determine which areas in the fabrication process require the most improvement.

BRIEF DESCRIPTION OF THE DRAWINGS

FIG. 1 is a block diagram depicting the steps performed by a preferred embodiment of the system of the present invention.

FIG. 2 is a block diagram depicting additional steps performed by the system of the present invention to effect a feedback loop.

FIG. 5 depicts pads within each pad frame depicted in FIG. 4.

FIG. 6 depicts two types of pad frame structures which contain van der Pauw structures.

DETAILED DESCRIPTION

Figure 3:
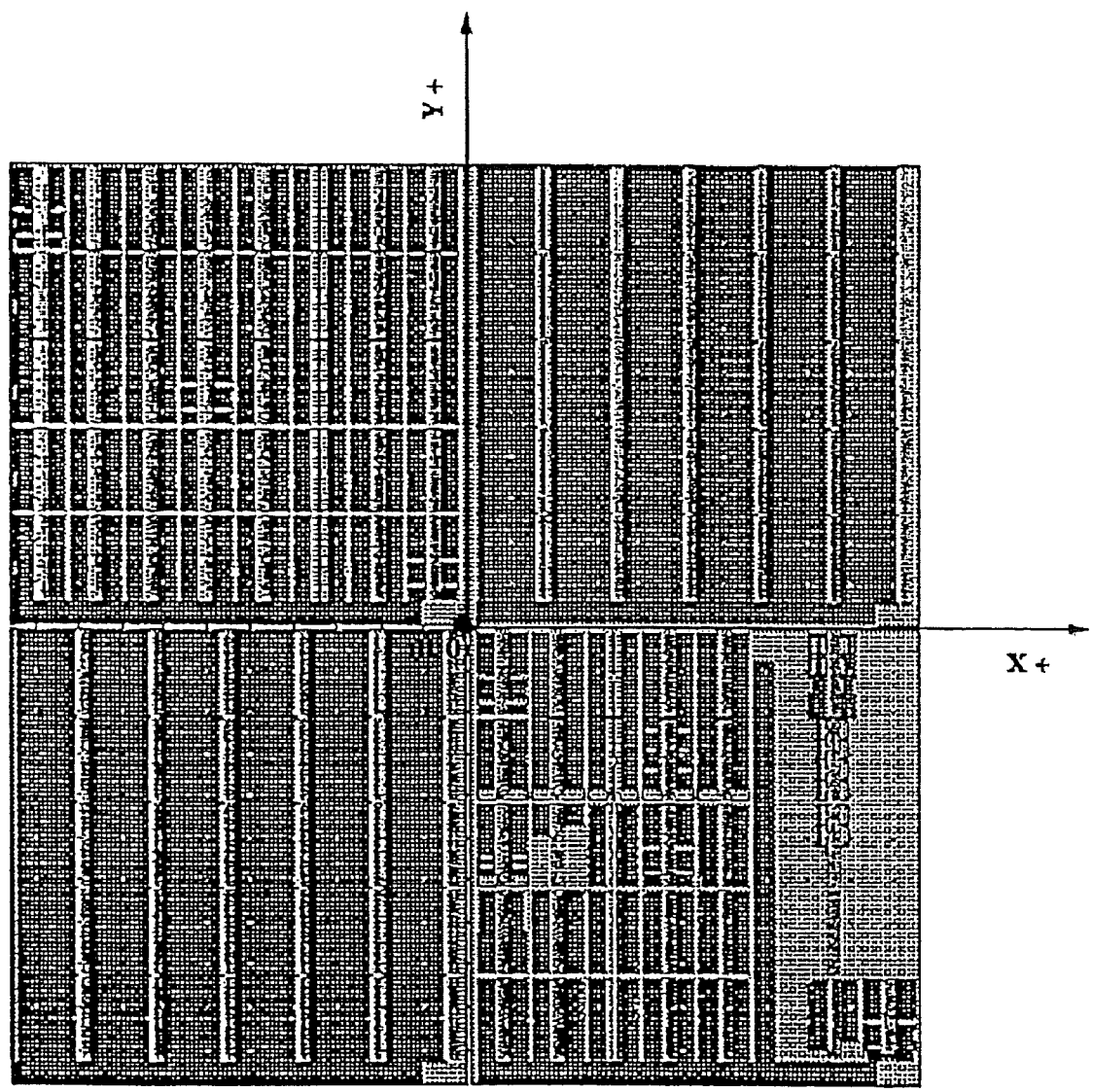
FIG. 3 is an image of an illustrative short flow mask comprising a single lithographic layer.

Referring now to FIG. 1, there is shown a block diagram depicting the steps performed by a system, generally designated 10, for predicting integrated circuit yields in accordance with the present invention. The system 10 utilizes at least one type of characterization vehicle 12. The characterization vehicle 12 preferably is in the form of software containing information required to build an integrated circuit structure which incorporates at least one specific feature representative of at least one type of feature to be incorporated into the final product. For example, the characterization vehicle 12 might define a short flow test vehicle of a single lithographic layer for probing the health and manufacturability of the metal interconnection module of the process flow under consideration. The structures need to be large enough and similar enough to the actual product or type of products running in the fabrication process to enable a reliable capture or fingerprint of the various maladies that are likely to affect the product during the manufacturing. More specific examples and descriptions of short flows and the structures embodied in them are described below.

Short flow is defined as encompassing only a specific subset of the total number of process steps in the integrated circuit fabrication cycle. For example, while the total fabrication cycle might contain up to 450 or more process steps, a characterization vehicle such as one designed to investigate manufacturability of a single interconnection layer would only need to include a small number, for example 10 to 25 process steps, since active devices and multiple interconnection layers are not required to obtain a yield model or allow accurate diagnosis of the maladies afflicting these steps associated with a single interconnection layer in the process flows.

The characterization vehicle 12 defines features which match one or more attributes of the proposed product layout. For example, the characterization vehicle 12 might define a short flow test vehicle having a partial layout which includes features which are representative of the proposed product layout (e.g. examples of line size, spacing and periodicity; line bends and runs; etc.) in order to determine the maladies likely afflicting those specific design types and causing yield loss.

The characterization vehicle 12 might also define one or more active regions and neighboring features of the proposed design in order to explore impact of layout neighborhood on device performance and process parameters; model device parameters as a function of layout attributes; and determine which device correlate best with product performance. Furthermore, by constructing and analyzing a sufficient number of short flow vehicles such that the range of all possible or a major subset of all the modular components of the entire process is exercised, a full evaluation of many if not all of the yield problems which will afflict the specific product manufactured can be uncovered, modeled, and/or diagnosed.

In addition to providing information for assessing and diagnosing yield problems likely to be seen by the product(s) under manufacture, the characterization vehicle is designed to produce yield models 16 which can be used for accurate yield prediction. These yield models 16 can be used for purposes including, but not limited to, product planning, prioritizing yield improvement activities across the entire process, and modifying the original design of the product itself to make it more manufacturable.

The majority of the test structures in the characterization vehicle 12 contemplated in the invention are designed for electrical testing. To this end, the reliability of detecting faults and defects in the modules evaluated by each characterization vehicle is very high. Inspection equipment cannot deliver or promise this high degree of reliability. Furthermore, the speed and volume of data collection is very fast and large respectively since electrical testing is fast and cheap. In this way, statistically valid diagnosis and/or yield models can be realized.

The characterization vehicle 12 is preferably in the form of a GDS 2 layout on a tape or disc which is then used to produce a reticle set. The reticle set is used during the selected portions of the fabrication cycle 14 to produce the yield model 16. Thus the yield model 16 is preferably constructed from data measured from at least a portion of a wafer which has undergone the selected fabrication process steps using the reticle set defined by the characterization vehicle 12.

The yield model 16 not only embodies the layout as defined by the characterization vehicle, it also includes artifacts introduced by the fabrication process operations themselves. The yield model 16 may also include prototype architecture and layout patterns as well as features which facilitate the gathering of electrical test data and testing prototype sections at operating speeds which enhances the accuracy and reliability of yield predictions.

An extraction engine 18 is a tool for extracting layout attributes from a proposed product layout 20 and plugging this information into the yield model 16 to obtain a product yield prediction 22. Such layout attributes might include, for example, via redundancy, critical area, net length distribution, and line width/space distribution. Then, given layout attributes from the proposed product layout 20 and data from yield models 16 which have been fabricated based upon information from the characterization vehicles 12, product yield 22 is predicted. Using the system and method of the present invention, the predictable product yield obtainable can be that associated with each defined attribute, functional block, or layer, or the resultant yield prediction for the entire product layout.

Referring now to FIG. 2, there is shown a block diagram of the system for predicting integrated circuit yields 10 in accordance with the present invention additionally comprising a feedback loop, generally designated 24, for extracting design attributes 26 from product layout 20 by means of extraction engine 28. In accordance with this feature of the present invention, the characterization vehicle 12 is developed using attributes of the product layout 20. In this case, attributes of the product layout are extracted, making sure that the range of attributes are spanned in the characterization vehicle 12. For example, the product layout is analyzed to determine line space distribution, width distribution, density distribution, the number of island patterns, in effect developing a subset of the entire set of design rules of the fabrication process, which subset is applicable to the particular product layout under consideration. With respect to patterns, the product layout analysis would determine the most common pattern, the second most common pattern, and so forth. These would be extracted by the extraction engine 28 yielding design attributes 26 encompassing all of these patterns for inclusion into the characterization vehicle 12.

With respect to densities, if the analysis of the product layout reveals that the density of a first metal is from 10% to 50%, then the characterization vehicle would include the entire range of 10% to 50% for the first metal.

One type of characterization vehicle is a metal short flow characterization vehicle. The purpose of the metal short flow characterization vehicle is to quantify the printability and manufacturability of a single interconnect layer. Usually a metal short flow is run very early in the process since metal yield is crucial for high product yield, is often very difficult to obtain, and consists of only a few independent processing steps. Conducting short flow experiments using a metal short flow mask, enables experiments and analysis to be carried out in rapid succession to eliminate or minimize any systematic yield or random defect yield issue that is detected without having to wait for complete flow runs to finish.

Figure 4:
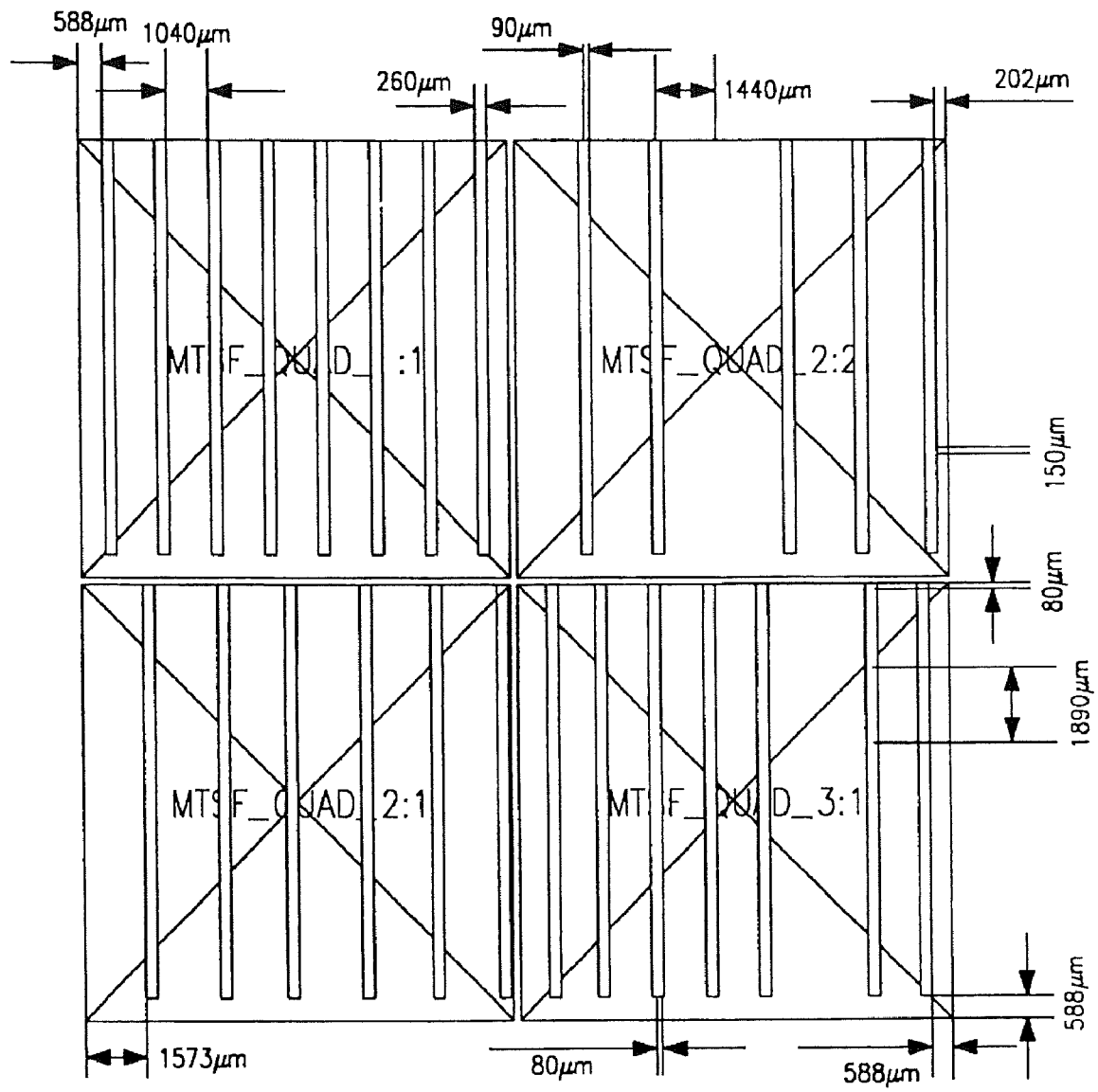
FIG. 4 depicts pad frames on an exemplary metal short flow chip.

Referring to FIG. 3, there is shown an image of a typical and illustrative metal short flow mask, generally designated 30, which consists of a single lithographic layer. The mask 30 is used to define a single metal layer on a chip, and the exemplary chip 32 depicted in FIG. 3 is as large as the stepper can accommodate which is, in this example, approximately 22 mm×22 mm in size. It is divided into four quadrants, 42, 4, 46 and 48 as shown in FIG. 4, each containing one or more of six basic structures: (i) Kelvin metal critical dimension structures; (ii) snake and comb structures; (iii) nest defect size distribution structures; (iv) van der Pauw structures; (v) OPC evaluation structures; and (vi) classical scanning electron microscopy (SEM) structures.

Approximately 50% of the chip area is devoted to nest structures for extraction of defect size distribution while 40% of the chip area is devoted to detecting systematic yield loss mechanisms and measuring parametric variation. FIG. 3 also depicts the location of pad frames 34 on the chip. In the embodiment described herein, there are 131 pad frames on the chip, with each pad frame 34 comprising thirty-two pads as shown in FIG. 5. The pads within each pad frame 34 provide electrical connection points which are contacted by external test equipment as required by a test program to be described later.

Figure 7:
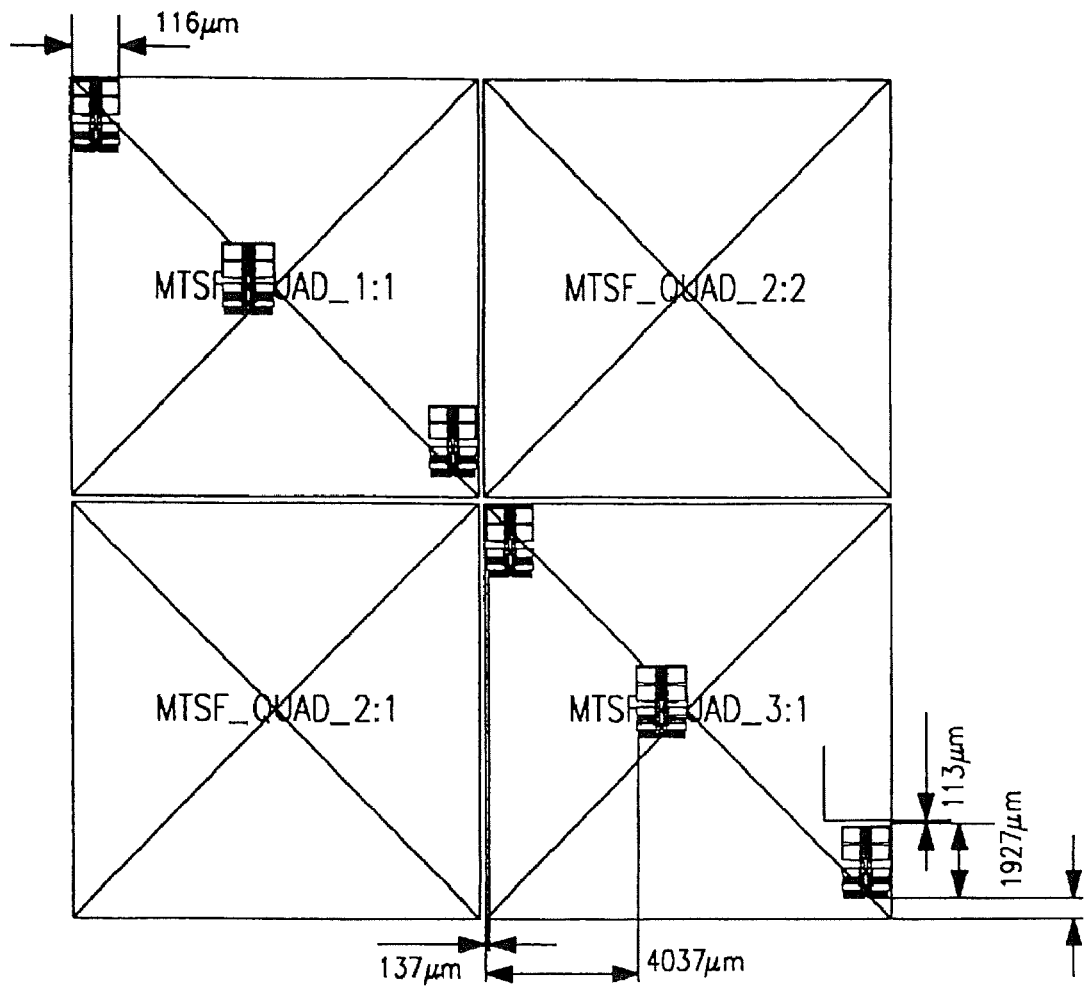
FIG. 7 depicts locations, on the exemplary chip, of the pad frames containing the van der Pauw structures.
Figure 8:
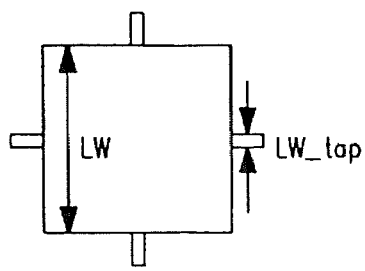
FIG. 8 depicts an exemplary van der Pauw structure.

The van der Pauw test structures 82 used in this chip (see FIG. 8) are four terminal square structures which take advantage of the symmetry of the structure for direct determination of the sheet resistance. Accurate determination of sheet resistance is a requirement for measurement of linewidth variation. The van der Pauw structures 82 are arranged in two different frame types: mixed 62 (see FIG. 6A) and VDP 1 64 (see FIG. 6 B). FIG. 7 depicts the location of the pad frames 72 containing the van der Pauw structures in the exemplary metal short flow chip described herein. In this exemplary chip, the van der Pauw structures occupy less than 1% of the chip area. In the van der Pauw structures the line width (LW) and the LW tap (see FIG. 8) are the parameters that are varied. Table I shows the variations in the van der Pauw structures in the exemplary metal short flow chip described herein.

TABLE I

| LW (μm) | LW tap (μm) |
|---|---|
| 1 (DR) | 1 (DR) |
| 1.1 | 1.1 |
| 5 | 1 |
| 10 | 2 |
| 25 | 5 |
| 35 | 7 |
| 35 | 3.5 |
| 50 | 5 |

Figure 9:
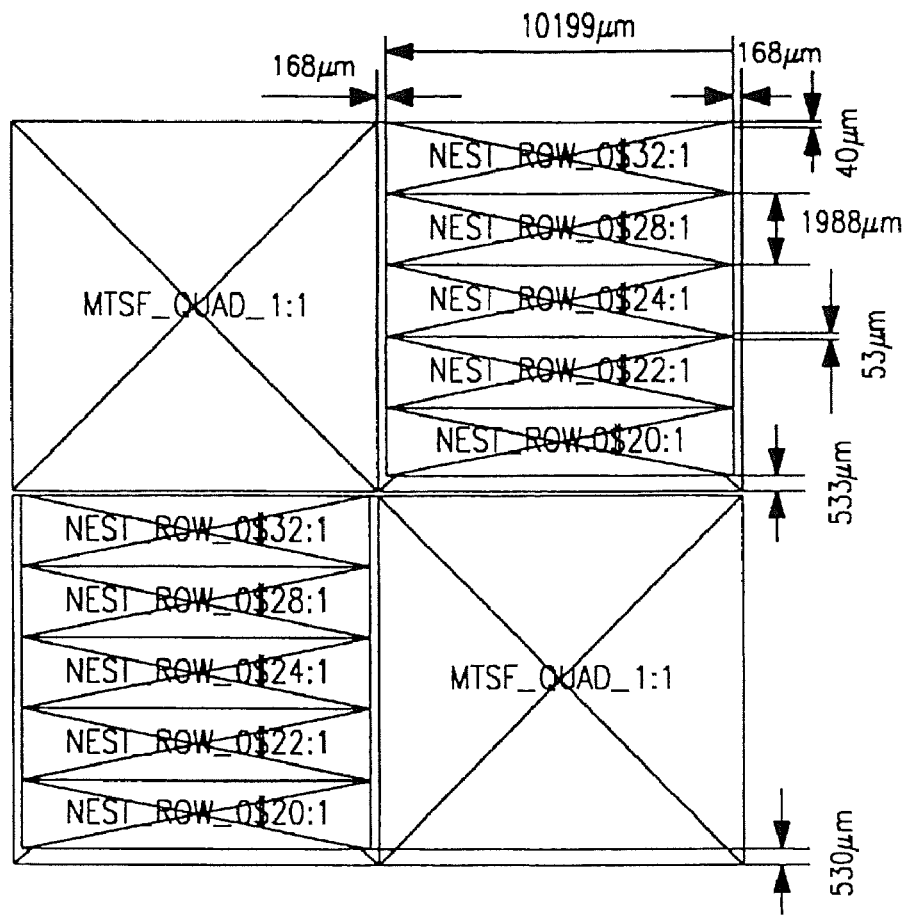
FIG. 9 depicts exemplary locations of nest defect size distribution structures on an exemplary metal short flow chip.

The nest defect size distribution structures are arrays of nested continuous lines designed for opens and shorts detection and for the extraction of defect size distribution. Line width and space between the line are the parameters that are varied to facilitate the extraction of defect size distribution. In the embodiment described herein, these structures occupy 50% of the chip area at locations 92 and 94 shown in FIG. 9 and have fourteen variants in a total of ten cells 96. The amount of area these structures can occupy needs to be large enough to accurately detect less than 0.25 defects/cm$^2$ for one wafer. The number of variants typically include the design rule (DR), slightly below DR, slightly above DR and substantially above DR. Therefore, for example, if DR is 1.0 μm for line spacing, the plots might be for 0.9, 1.1, 1.3 and 2.5 as shown in Table II.

TABLE II

| Line Width = Space (μm) | Length (cm) |
|---|---|
| 0.9 | 39.6 |
| 1.0 (DR) | 36 |
| 1.1 | 33 |

TABLE II-continued

| Line Width = Space (μm) | Length (cm) |
|---|---|
| 1.3 | 28.2 |
| 2.5 | 24.6 |

Figure 10:
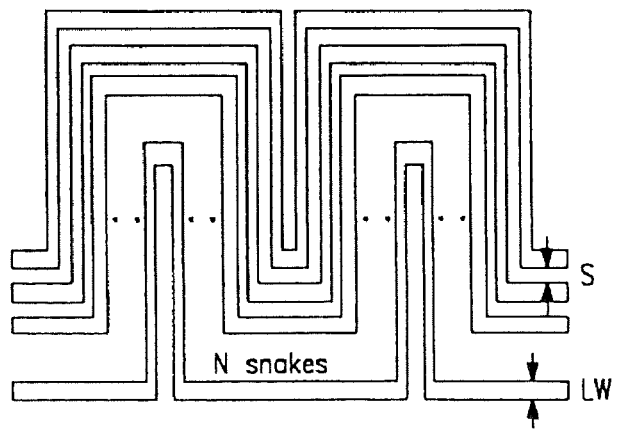
FIG. 10 depicts an exemplary nest defect size distribution structure.

Each cell is split into six sub-cells to reduce the line resistance to reasonable levels (less than 250 kΩ) and to minimize the incidence of multiple defects per cell. In this embodiment, there are sixteen snakes per cell. An exemplary nest defect size distribution structure itself, generally designated 1002, is depicted in FIG. 10. The nest defect size distribution structures are designed such that the line width (LW) is equal to the spacing (S) between the lines to simplify subsequent analysis of data.

Figure 11:
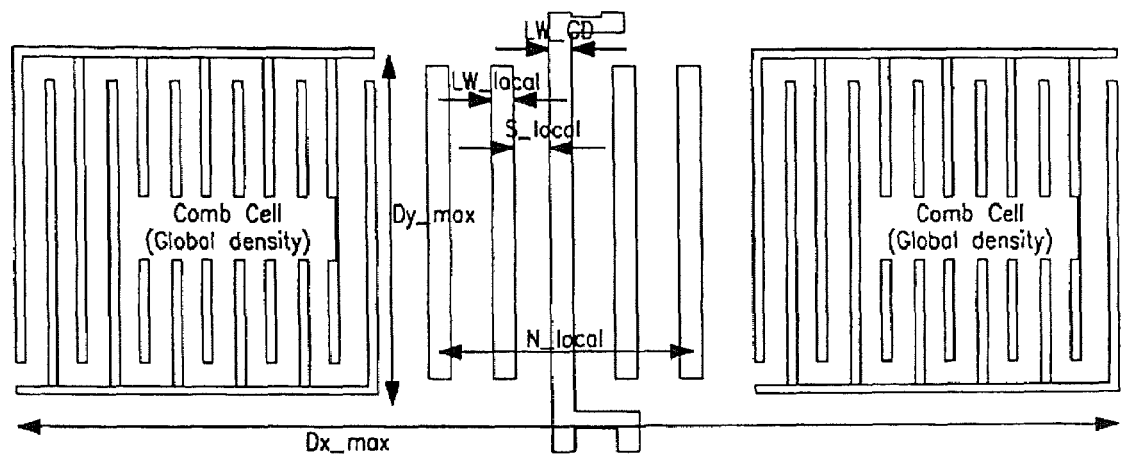
FIG. 11 depicts an exemplary Kelvin critical dimension structure.
Figure 12:
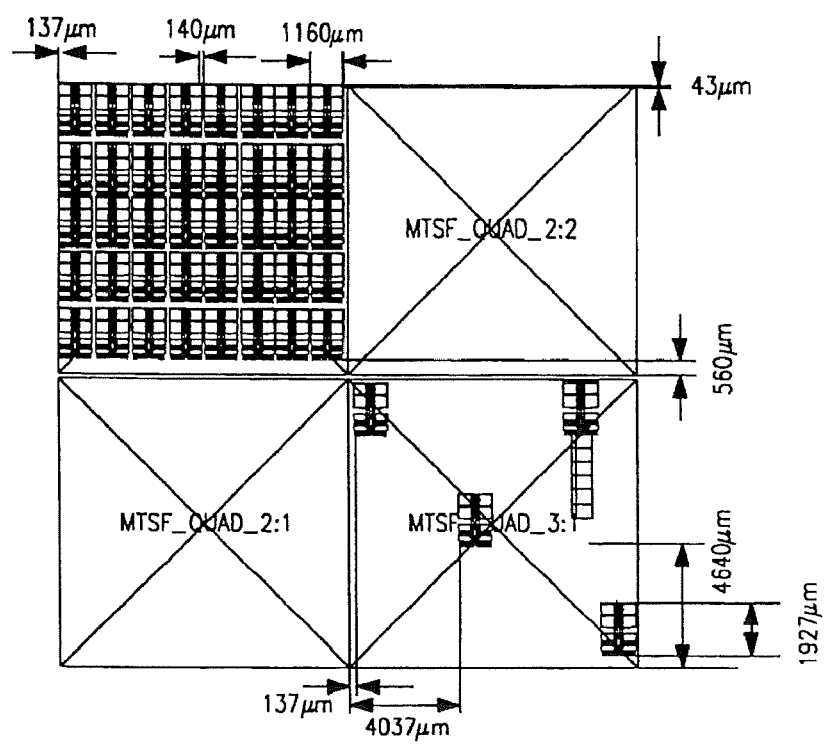
FIG. 12 depicts exemplary locations of Kelvin structures on an exemplary metal short flow chip.

The Kelvin metal critical dimension (CD) structures are made up of a continuous straight line with terminal connections at each end. These structures allow for precise line resistance measurements which, in conjunction with the sheet resistance determined from the van der Pauw structures, allow for the determination of Kelvin line width. These structures are designed primarily to determine the variation in the electrical critical dimension. An exemplary Kelvin critical dimension structure, generally designated 110, is depicted in FIG. 11. To study the impact of optical proximity effect on the variability in the electrical critical dimension, local neighborhood structures are varied. The parameters varied for the local neighborhood are the number 112, line width 114 and space 116 of the lines. The global environment 118 around the Kelvin structures is also varied, primarily to study etch related effects on the electrical critical dimension (see FIG. 11). Parameters varied for global neighborhood are the density and area. The global neighborhood structures can also serve other electrical measurement needs. For example, the yield of these structures can be measured so that not only metal critical dimension as a function of environment is obtained, but also yield as a function of environment. FIG. 12 depicts the location of Kelvin structures 122 in the metal short flow chip described herein. These locations are chosen to cover available area. Tables III through IX describe the variations in the Kelvin structures used in the metal short flow chip described herein. These values were chosen as to cover the space identified in FIG. 22(*a*) through 22(*b*). For example, the pattern density is centered around 45% and the line width and spaces are in the range of 1.0 to 3.3 mm since this is where most of an exemplary product layout is centered.

TABLE III

| Line Width (μm) | Spacing (μm) | Number of Local Lines | Fixed Parameters |
|---|---|---|---|
| 0.75 | 0.75 | 6 | Local line width = 1 μm |
| 0.9 | 0.9 | | Density = 45% |
| 1 μm (DR) | 1.0 (DR) | | Line width of comb = 1.3 μm |
| 1.1 | 1.1 | | Dx max = 400 (μm) |
| 1.3 | 1.3 | | Dy max = 400 (μm) |
| 2.5 | 2.5 | | |
| 3.3 | 3.0 | | |
| 10 | 3.3 | | |
| | 10 | | |
| | 50 | | |

TABLE IV

| Line Width (μm) | Space ratio | Number of Local Lines | Fixed Parameters |
|---|---|---|---|
| 0.75 | 2 to 1 | 6 | Local line width = 1 μm |
| 0.9 | 3 to 1 | 2 | Density = 45% |
| 1 (DR) | | | Line width of comb = 1.3 μm |
| 1.1 | | | Dx max = 400 (μm) |
| 1.3 | | | Dy max = 400 (μm) |
| 2.5 | | | |
| 3.3 | | | |
| 10 | | | |

TABLE V

| Line Width (μm) | Number of Local lines | Local Line Width (μm) | Spacing (μm) | Fixed Parameters |
|---|---|---|---|---|
| 0.75 | 1 | 1 (DR) | 1 (DR) | Density = 0.45 |
| 0.9 | 2 | 1.3 | 1.3 | Line width of comb = 1.3 μm |
| 1 (DR) | 4 | | | Dx max = 400 (μm) |
| 1.1 | | | | Dy max = 400 (μm) |
| 1.3 | | | | |
| 2.5 | | | | |
| 3.3 | | | | |
| 10 | | | | |

TABLE VI

| Line Width (μm) | Spacing (μm) | Number of local lines | Density | LW comb (μm) | Fixed Parameters |
|---|---|---|---|---|---|
| 1.0 (DR) | 1.0 (DR) | 6 | 0 | 1.3 | Dx max = 400 (μm) |
| 1.3 | 1.3 | 2 | 0.2 | 10 | Dy max = 400 (μm) |
| | | | 0.40 | | |
| | | | 0.45 | | |
| | | | 0.50 | | |

TABLE VII

| Line Width (μm) | Spacing (μm) | Line width local (μm) | Fixed Parameters |
|---|---|---|---|
| 0.9 | 1.0 (DR) | 10 | Number of local lines 2 |
| 1.0 (DR) | 1.1 | 30 | Density 0.45 |
| 1.1 | 1.3 | 100 | Line width comb 1.3 |
| 1.3 | 2.5 | | Dx max = 400 (μm) |
| 2.5 | 3.3 | | Dy max = 400 (μm) |
| 3.3 | 10 | | |
| 10 | | | |

TABLE VIII

| Line Width (μm) | Spacing (μm) | Fixed Parameters |
|---|---|---|
| 1.0 (DR) | 1.0 (DR) | Number of local lines 6 |
| 1.1 | 1.1 | Density - 0.45 |
| 1.3 | 1.3 | Line width comb 1.3 |
| 2.5 | 2.5 | Dx_max = 400(μm) |
| 10 | 3.0 | Dy_max = 400(μm) |
| | 5.3 | Line width local 1.3 |

TABLE IX

| Line Width (µm) | Spacing (µm) | Local density | Dx_max | Fixed Parameters | Comments |
|---|---|---|---|---|---|
| 0.75 | | | | Number of local lines 0 | Isolated Kelvins |
| 0.9 | | | | Density 0 | |
| 1.0 (DR) | | | | Line width comb 0 | |
| 1.1 | | | | Line width local 0 | |
| 1.3 | | | | Dx_max = 400(µm) | |
| 2.5 | | | | Dy_max = 400 (µm) | Local |
| 3.3 | | | | Line width = 1.0 (µm) | neighborhood |
| 10 | | | | Local line width = 1.0 | size |
| | 10 | 2.5 | | (µm) | |
| | 20 | 3.5 | | Number of local lines 2 | |
| | 30 | 4.5 | | Density 0.45 | |
| | 40 | 5.5 | | Comb line width 1.3 | |
| | 50 | 6.5 | | Dx_max = 400(µm) | |
| | 60 | 7.5 | | Dy_max = 400 (µm) | |
| | 70 | 8.5 | | | |
| | 80 | 9.5 | | | |
| | | | 25 | Line width 1.0 | Global |
| | | | 50 | Line width local 1.0 | neighborhood |
| | | | 100 | Space 1.0 | size |
| | | | 150 | Number of local lines 6 | |
| | | | 200 | Density 0.45 | |
| | | | 250 | Line width comb 1.3 | |
| | | | 300 | Dy_max 400 (µm) | |

| Line Width | Spacing | N_local | Dx_max | Fixed Parameters | Comments |
|---|---|---|---|---|---|
| 1.0 (DR) | 1.0 (DR) | 6 | | D_local 5 | Standards |
| 1.3 | 1.3 | 6 | | Line width comb 1.3 | |
| 1.0 | 40 | 2 | | 0.45 | |
| 1.3 | 40 | 2 | | | |

Figure 13:
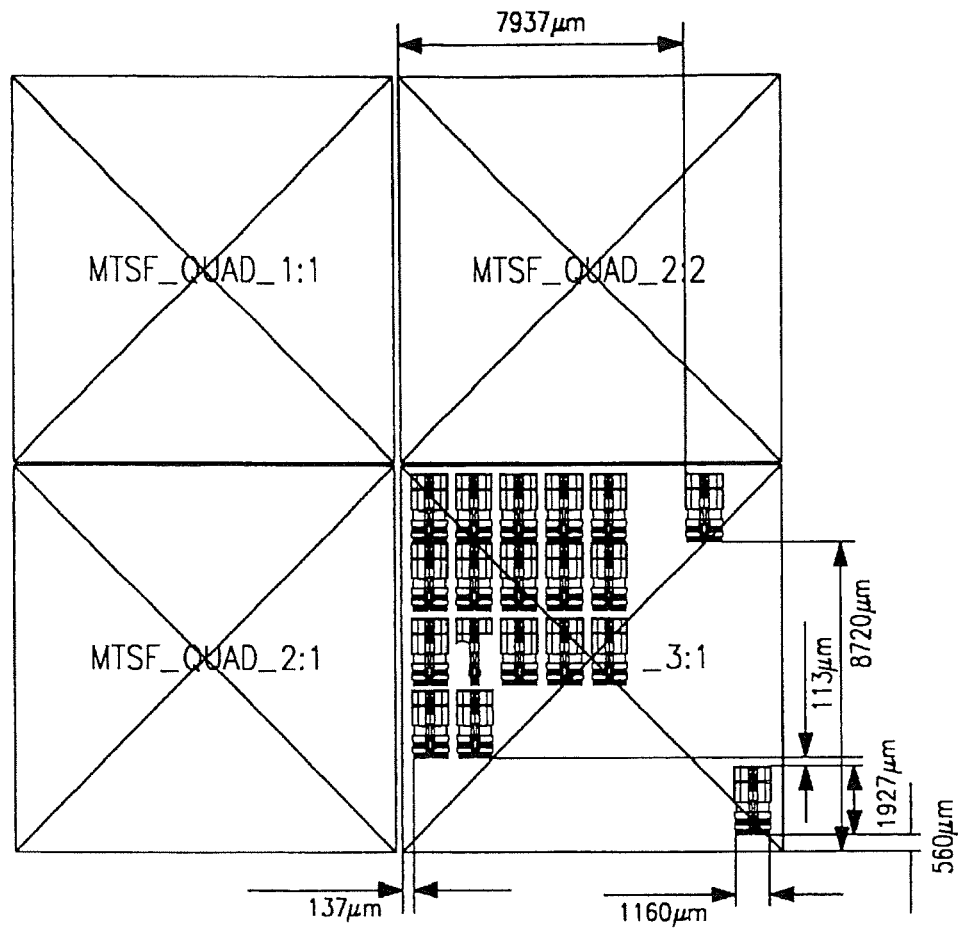
FIG. 13 depicts exemplary locations of snakes and combs on an exemplary metal short flow chip.
Figure 14:
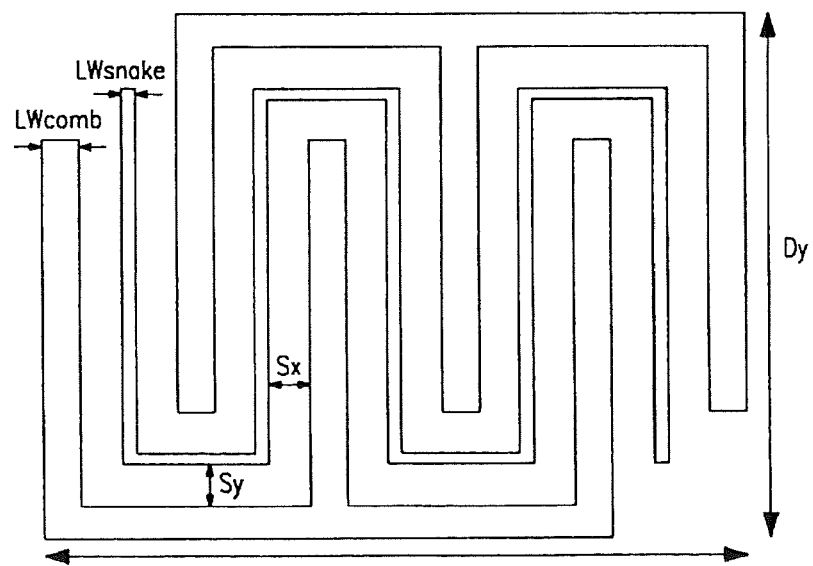
FIG. 14 depicts exemplary snake and comb structures used in an exemplary metal short flow chip.
Figure 22A:
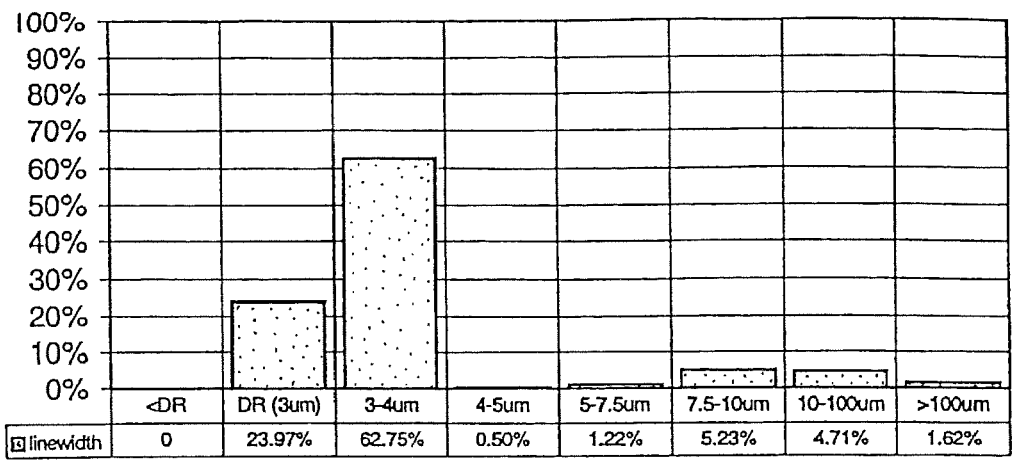
FIGS. 22(a), 22(b) and 22(c) depict, respectively, linewidth, linespace and pattern density distributions for a metal-1 layer of a sample product layout.
Figure 22B:
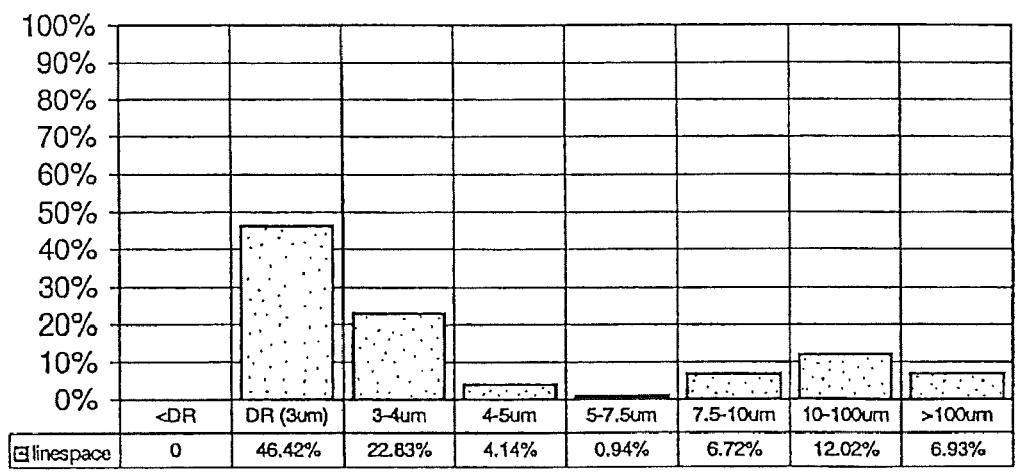
Figure 22C:
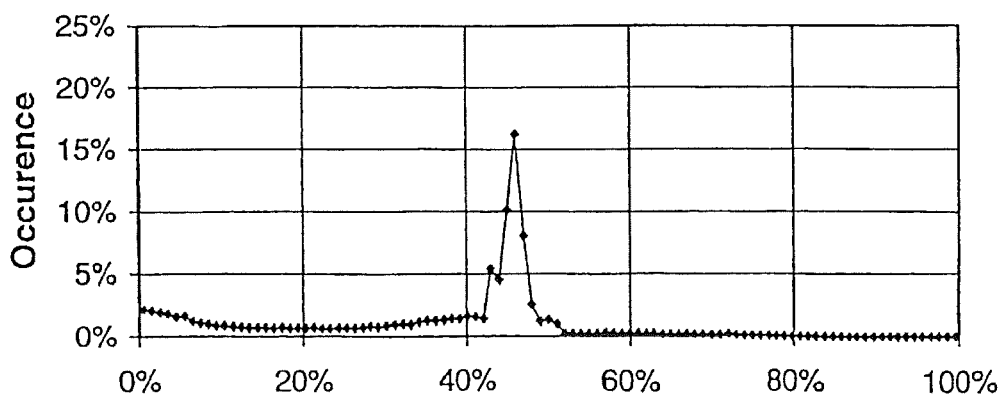

The snake, comb and snake & comb structures are designed primarily for the detection of shorts and opens across a wide variety of patterns. Snakes are used primarily for the detection of opens and can also be used for monitoring resistance variation. Combs are used for monitoring shorts. Shorts and opens are fundamental yield loss mechanisms and both need to be minimized to obtain high product yield. FIG. 13 shows the location of snakes and combs 1302 in the metal short flow chip described herein. Quadrant one 1304 also contains snakes 1402 and combs 1404 nested within the Kelvin structures as shown, for example in FIG. 14. Line width (LW) and space (S), see FIG. 14, are the parameters varied on these structures to study their impact on shorts and opens. Tables X through XIII describe the variations of snake and comb structures used in the metal short flow chip described herein. Again, the parameters were chosen such that the space covered in line width, line space, and density is similar to that seen in the example product layout, as shown in FIG. 22(*a*) through 22(*c*).

TABLE X

| LW_comb (µm) | Space (µm) | LW_snake (µm) | Fixed Parameters |
|---|---|---|---|
| 20 | 0.9 | 1.0 (DR) | Dx_max = 200 µm |
| 50 | 1.0 (DR) | | Dy_max = 400 µm |
| 100 | 1.1 | | |
| 200 | 1.3 | | |
| 300 | 2.5 | | |
| | 3.0 | | |
| | 3.3 | | |
| | 10 | | |
| 20 | 1.3 | 1.3 | |
| 50 | 3.1 | | |
| 100 | 3.3 | | |
| 200 | 3.5 | | |
| 300 | 10 | | |

TABLE XI

| LW_comb (µm) | Space (µm) | Fixed Parameters |
|---|---|---|
| 0.75 | 0.75 | Dx_max = 200 µm |
| 0.9 | 0.9 | Dy_max = 400 µm |
| 1.0 (DR) | 1.0 (DR) | |
| 1.1 | 1.1 | |
| 1.3 | 1.2 | |
| 2.0 | 1.3 | |
| 3.3 | 2.5 | |
| 10 | 3.0 | |
| | 3.3 | |
| | 10 | |

TABLE XII

| Line Width (µm) | Fixed Parameters |
|---|---|
| 0.75 | Dx_max = 200 µm |
| 0.9 | Dy_max = 400 µm |
| 1.0 (DR) | 10 µm |
| 1.1 | |
| 1.3 | |
| 2.5 | |
| 3.3 | |
| 1.0 | |

TABLE XIII

| LW (µm) | Space (nm) | Fixed Parameters |
|---|---|---|
| 20 | 0.7 | Dx_max = 400 µm |
| 50 | 1.0 (DR) | Dy_max = 200 µm |
| 100 | 1.1 | |
| 200 | 1.3 | |
| 500 | 2.5 | |
| | 2.7 | |

TABLE XIII-continued

| LW (μm) | Space (nm) | Fixed Parameters |
|---------|------------|------------------|
|         | 3.0        |                  |
|         | 3.3        |                  |
|         | 5          |                  |
|         | 10         |                  |

Figure 15:
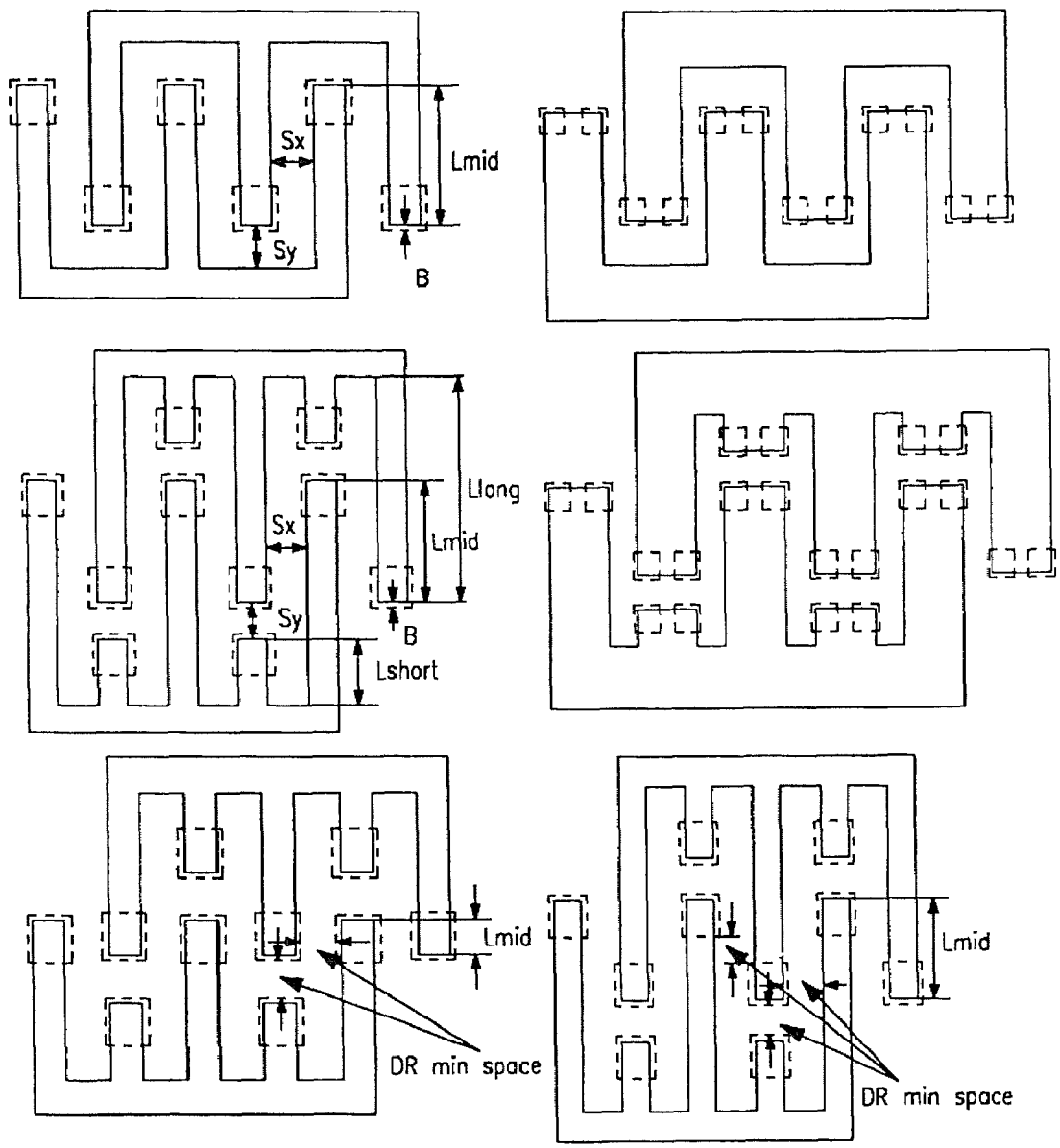
FIG. 15 depicts examples of variations of border structures used in an exemplary metal short flow chip.
Figure 16:
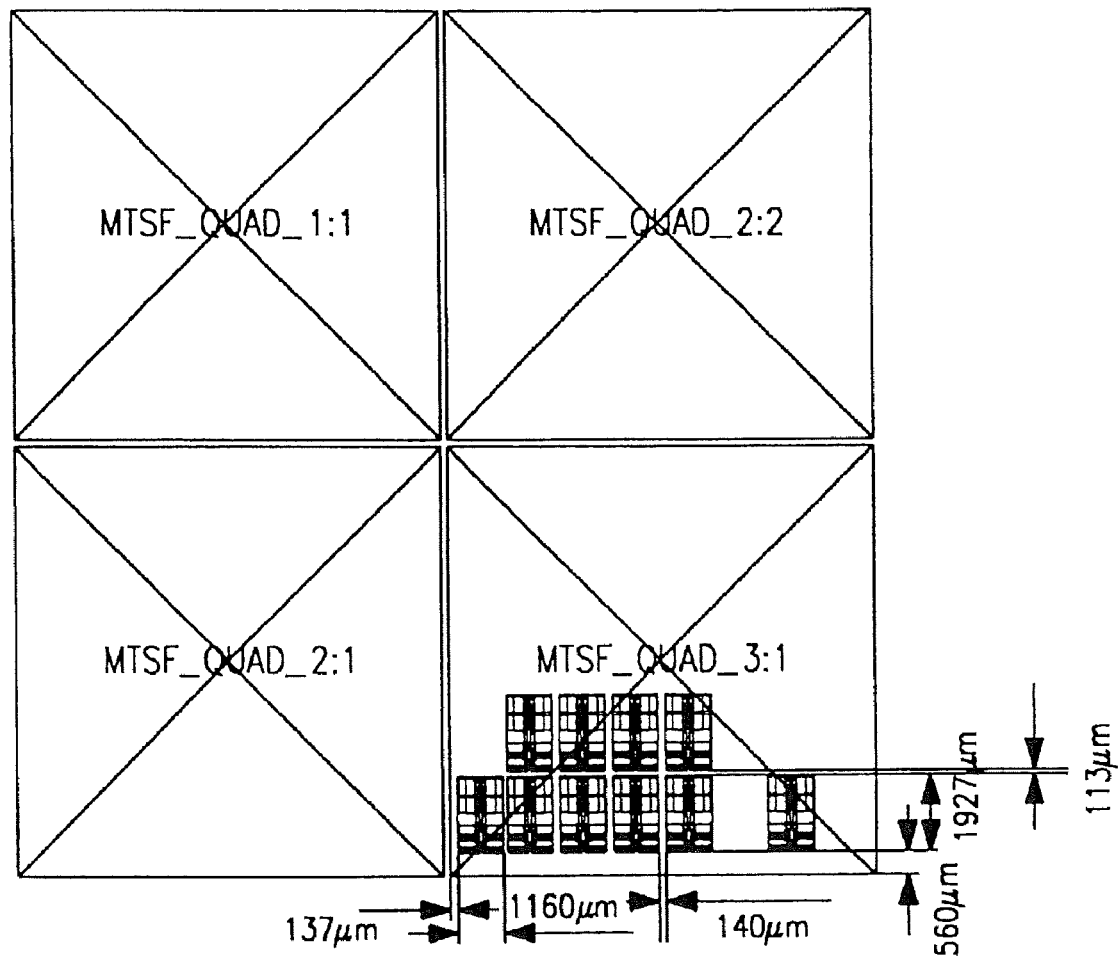
FIG. 16 depicts exemplary locations of border structures on an exemplary metal short flow chip.

Border and fringe structures are designed to study the impact of optical proximity correction (OPC) structures on shorts. These optical proximity corrections are usually added to improve via yields. However, it is necessary to check metal short yield with and without these borders to ensure that there is no detrimental impact to short yield. Borders 1502 are placed both at the end of the comb lines and in the interior of comb structures, generally designated 1504, as shown in FIG. 15. FIG. 16 shows the location of border structures, generally designated 1602, in the metal short flow chip described herein.

Figure 17:
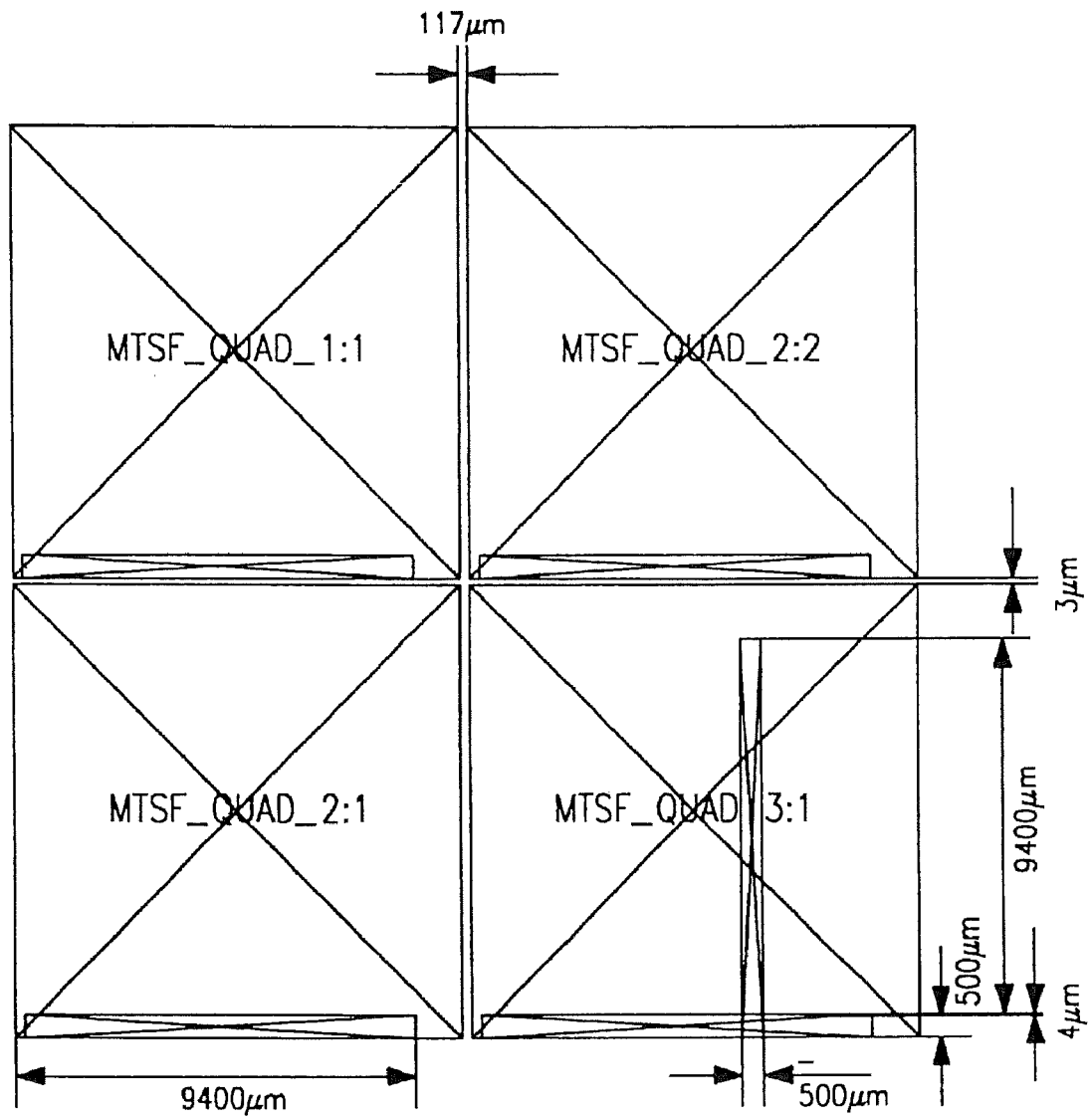
FIG. 17 depicts exemplary locations of scanning electron microscope structures on an exemplary metal short flow chip.

Scanning electron microscopy (SEM) structures are used for non-electrical measurements of line width through top down or cross sectional SEM. For the SEM bars in the metal short flow chip described herein the line width is the same as the spacing between the lines in accordance with traditional SEM techniques. FIG. 17 depicts the location of the SEM structures 1702 in the metal short flow chip described herein. The structures are placed at the bottom of each quadrant 1704, 1706, 1708 and 1710 of the embodiment depicted since this is where space was available.

In FIGS. 3 through 17, and accompanying text, an example characterization vehicle for metal yield improvement has been described. Other characterization vehicles for via, device, silicides, poly, el al, are often designed and utilized. However, the procedure and techniques for designing them are the same. For purposes of illustration, the example metal characterization vehicle will be carried through on extraction engines and yield models.

The extraction engine 18 has two main purposes: (1) it is used in determining the range of levels (e.g. linewidth, linespace, density) to use when designing a characterization vehicle. (2) It is used to extract the attributes of a product layout which are then subsequently used in the yield models to predict yield. (1) has already been described above with reference to how the line width, space and density of the snake, comb and Kelvin structures were chosen in the example characterization vehicle. Thus, most of the following discussion focuses on (2).

Since there are nearly infinite numbers of attributes that can be extracted from the product layout, it is impossible to list or extract all of them for each product. Thus, a procedure is required to guide which attributes should be extracted. Usually, the characterization vehicle drives which attributes to extract. The process consists of:

1. List all structures in the characterization vehicle
2. Classify each structure into groups or families such that all structures in the family form an experiment over a particular attribute. For example, in the metal characterization vehicle discussed above, a table of family classifications might be:

| Family | Attributes Explored |
|--------|---------------------|
| Nest structures | Basic defectivity over a few linewidths and spaces |
| Snakes and Combs | Yield over wide range of linewidths and spaces including very large widths next to small spaces and very large spaces next to small widths. |
| Kelvin-CD + van der Pauws | CD variation across density, linewidth, and linespace. |
| Border structures | Effect of different OPC schemes on yield. |

3. For each family, determine which attributes must be extracted from the product layout. The exact attributes to choose are driven from which attributes are explored. For example, if a particular family explores yield over different ranges of space, then either a histogram of spaces or the shortable area for each space must be extracted. For the above example, the required list of attributes might be:

| Family | Attributes Explored | Attributes to Extract from Product Layout |
|--------|---------------------|-------------------------------------------|
| (A) Nest structures | Basic defectivity over a few linewidths and spaces. | Critical area curves. |
| (B) Snakes and combs | Yield over wide range of linewidths and spaces including . . . | Shortable area and/or instance counts for each line width and space explored in the characterization vehicle. |
| (C) Kelvin-CD and van der Pauws | CD variation across density, linewidth, and space | Histograms of pattern density, linewidth, and linespace (similar to example shown in FIG. 22) |
| (D) Border structures | Effect of different OPC schemes on yield | For each OPC scheme selected to use on product layout, the shortable area or instance count. |

4. Use the attributes extracted in the appropriate yield models as previously described.

For other characterization vehicles, the families and required attributes will obviously be different. However, the procedure and implementation is similar to the example described above.

As previously stated, the yield model 16 is preferably constructed from data measured from at least a portion of a wafer which has undergone the selected fabrication process steps using the reticle set defined by the characterization vehicle 12. In the preferred embodiment, the yield is modeled as a product of random and systematic components:

$$Y = \left(\prod_{i=1}^{n} Ys_i\right)\left(\prod_{j=1}^{m} Yr_j\right)$$

The methods and techniques for determining $Ys_i$ and $Yr_j$ are as follows.

Systematic Yield Modeling

Since there are so many types of systematic yield loss mechanisms and they vary from fab to fab, it is not practicable to list every possible systematic yield model. However, the following describes two very general techniques and gives an example of their use especially within the context of characterization vehicles and the methodology described herein.

Area Based Models

The area based model can be written as:

$$Ys_i = \left[\frac{Y_o(q)}{Y_r(q)}\right]^{A(q)/A_a(q)}$$

Where q is a design factor explored in the characterization vehicle such as line width, line space, length, ratio of width/space, density, etc. $Y_o(q)$ is the yield of a structure with design factor q from the characterization vehicle. $A_o(q)$ is the shortable area of this structure and $A(q)$ is the shortable area of all instances of type q on the product layout. $Y_r(q)$ is the predicted yield of this structure assuming random defects were the only yield loss mechanism. The procedure for calculating this quantity is described below in connection with random yield modeling.

Figure 18:
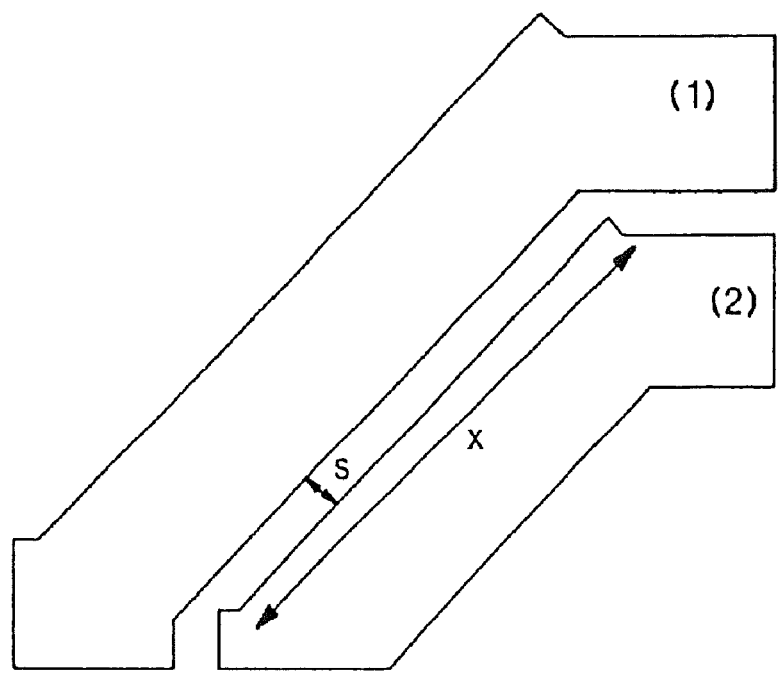
FIG. 18 depicts an exemplary test structure illustrating a shortable area.

The definition of shortable area is best illustrated with the example shown in FIG. 18. This type of test structure can be used to determine if the fab is capable of yielding wide lines that have a bend with a spacing of s. In this sample test structure, a short is measured by applying a voltage between terminal (1) and (2) and measuring the current flowing from terminal (1) to (2). If this current is larger than a specified threshold (usually 1-100 nA), a short is detected. The shortable area is defined to be the area where if a bridging occurs, a short will be measured. In the example of FIG. 18, the shortable area is approximately x*s). The $A(q)$ term is the shortable area of all occurrences of the exact or nearly exact pattern (i.e. a large line with a spacing of s and a bend of 45 degrees) shown in FIG. 18 in a product layout. The $Yr(q)$ term is extracted by predicting the random yield limit of this particular structure using the critical area method described below.

It is important to realize that the effectiveness of this model is only as good as the number of structures and size of structures placed on the characterization vehicle. For example, if the angled bend test structure shown in FIG. 18 were never put on the characterization vehicle or was not placed frequently enough to get a meaningful yield number, then there would be no hope of modeling the yield loss of wide line bends on the product layout. While it is difficult to define exactly how many of how big the test structure should be on the characterization vehicle, practical experience has shown that the total shortable area of each test structure on the characterization vehicle should ideally be such that $A(q)/Ao(q)<10$.

The above discussion has concentrated on shorts since they generally tend to dominate over open yield loss mechanisms. However, open yield loss mechanisms can be modeled equally well with this yield model so long as shortable area is replaced by open causing area.

Instance Based Yield Model

The general form of the instance based yield model is:

$$Ys_i = \left[\frac{Y_o(q)}{Y_r(q)}\right]^{N_i(q)/N_o(q)}$$

Where $Yo(q)$ and $Yr(q)$ are exactly the same as in the area based yield model. $Ni(q)$ is the number of times the unit cell pattern or very similar unit cell pattern to the test pattern on the characterization vehicle appears on the product layout. $No(q)$ is the number of times the unit cell pattern appears on the characterization vehicle.

Figure 19:
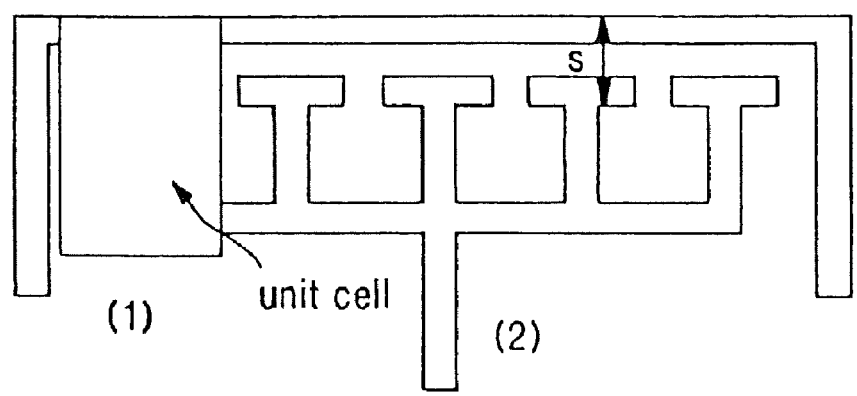
FIG. 19 depicts an exemplary test pattern for examining the yield of T-shaped endings at the ends of lines.

For example, FIG. 19 shows a simple test pattern for examining the yield of T-shaped endings at the ends of lines near a space of s. This test pattern is measured by applying a voltage across terminals (1) and (2) and measuring the shorting current. If this pattern was repeated 25 times somewhere on the characterization vehicle, then $No(q)$ would be $25 \times 5=125$ since there are five unit cells per each test structure.

If the number of times this unit cell occurs with a spacing of s near it is extracted from the product layout, the systematic yield of this type of structure can be predicted. For example, if there are five structures with 500 unit cells in each structure then $No(q)=2500$. If $Ni(q)$ from some product was 10,000 and a yield of the test structures on the characterization vehicle of 98.20% was measured. Using the techniques described below, $Yr(q)$ can be estimated as 99.67%. Using these numbers in the equation:

$$Ys_i = \left[\frac{0.9820}{0.9967}\right]^{10000/2500} = 92.84\%$$

Random Yield Modeling

The random component can be written as:

$$Y_r = e^{-\int_{X_0}^{\infty} CA(x) \times DSD(x) dx}$$

Where $CA(x)$ is the critical area of defect size x and $DSD(x)$ is the defective size distribution, as also described in "Modeling of Lithography Related Yield Losses for CAD of VSLI Circuits", W. Maly, IEEE Trans. on CAD, July 1985, pp1 61-177, which is incorporated by reference as if fully set forth herein. Xo is the smallest defect size which can be confidently observed or measured. This is usually set at the minimum line space design rule. The critical area is the area where if a defect of size x landed, a short would occur. For very small x, the critical area is near 0 while very large defect sizes have a critical area approaching the entire area of the chip. Additional description of critical area and extraction techniques can be found in P. K. Nag and W. Maly, "Yield Estimation of VLSI Circuits," Techcon90, Oct. 16-18, 1990. San Jose; P. K. Nag and W. Maly, "Hierarchical Extraction of Critical Area for Shorts in Very Large ICs," in Proceedings of The IEEE International Workshop on Detect and Fault Tolerance in VLSI Systems, IEEE Computer Society Press 1995, pp. 10-18; 1. Bubel, W. Maly, T. Waas, P. K. Nag, H. Hartmann, D. Schmitt-Landsiedel and S. Griep, "AFFCCA: A Tool for Critical Area Analysis with Circular Defects and Lithography Deformed Layout," in Proceedings of The IEEE International Workshop on Detect and Fault Tolerance in VLSI Systems, IEEE Computer Society Press 1995, pp. 19-27; C. Ouyang and W. Maly, "Efficient Extraction of Critical Area in Large VISI ICs," Proc. IEEE International Symposium on Semiconductor Manufacturing, 1996, pp. 301-304; C. Ouyang, W. Pleskacz, and W. Maly, "Extraction of Critical Area for Opens in Large VLSI Circuits," Proc. IEEE International Workshop on Defect and Fault Tolerance of VLSI Systems, 1996, pp. 21-29, all of which references are incorporated in this detailed description as if fully set forth herein.

The defect size distribution represents the defect density of defects of size x. There are many proposed models for defect size distributions (see, for example, "Yield Models—Comparative Study", W. Maly, Defect and Fault Tolerance in VLSI Systems, Ed. by C. Stapper, et al, Plenum Press, New York, 1990; and "Modeling of Integrated Circuit Defect Sensitivities", C.H. Stapper, IBM J. Res. Develop., Vol. 27, No. 6, November, 1983, both of which are incorporated by reference as if fully set forth herein), but for purposes of illustrations, the most common distribution:

$$DSD(x) = \frac{D_o \times k}{x^p}$$

will be used where Do represents the total number of defects/cm$^2$ greater than $x_o$ observed. P is a unitless value which represents the rate at which defects decay over size. Typically, p is between 2 and 4. K is a normalization factor such that $$\int_{x_o}^{\infty} \frac{k}{x^p} dx = 1$$

The following two sections describe techniques for extracting defect size distributions from characterization vehicles.

The Nest Structure Technique

Figure 20:
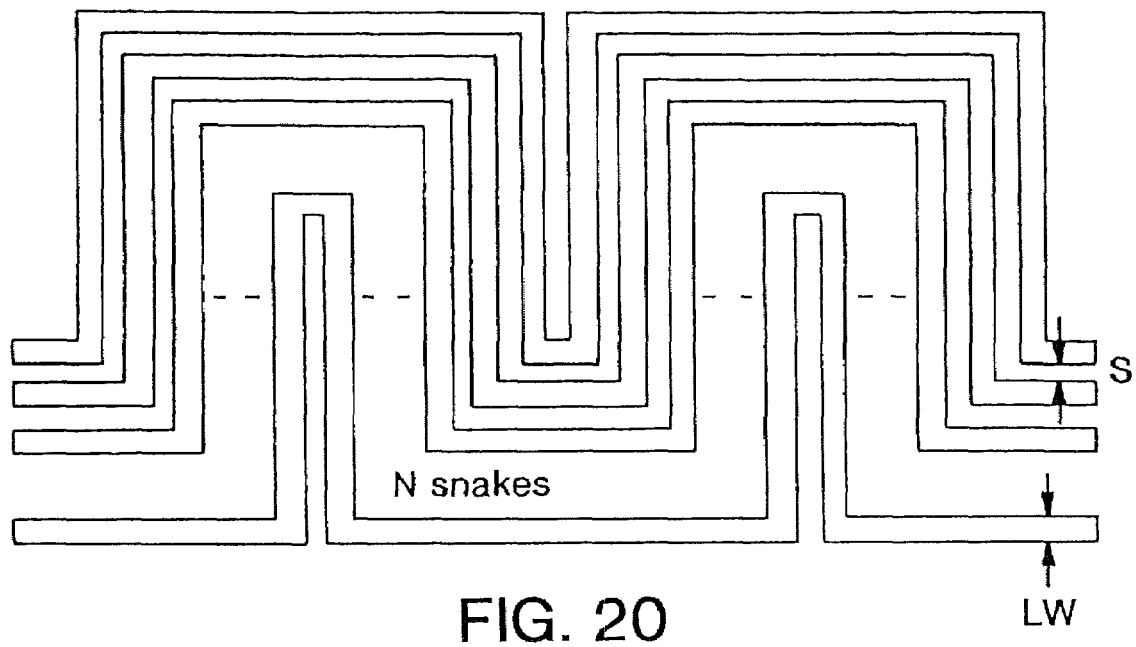
FIG. 20 depicts an exemplary nest structure for extracting defect size distributions.

The nest structure is designed for extracting defect size distributions. It is composed of N lines of width w and space s as shown in FIG. 20. This structure is tested by measuring the shorting current between lines 1 and 2, 2 and 3, 3 and 4, . . . , and N−1 and N. Any current above a given spec limit is deemed a short. In addition, opens can be testing by measuring the resistance of lines 1, 2, 3, . . . , N−1, and N. Any resistance above a certain spec limit is deemed to be an open line. By examining how many lines are shorted together the defect size distribution can be determined.

If only two lines are shorted then the defect size must be greater than s and no larger than 3w+2s. Any defects smaller than s will not cause a short at all while defects larger than 3w+2s are guaranteed to cause a short of at least 3 lines. For each number of lines shorted, an interval of sizes can be created:

| Number Lines Shorted | Size Interval |
|---|---|
| 2 | s to 3w + 2s |
| 3 | 2s + w to 3s + 4w |
| 4 | 3s + 2w to 4s + 5w |
| . . . | . . . |
| N | (N − 1)s + (N − 2)w to (N)s + (N + 1)w |

It should be noted that the intervals overlap; thus, a defect size distribution cannot be directly computed. This restriction only places a limit on p extraction. Thus, in order to estimate p, a p estimate is computed from the distribution from all the even number lines and then from all the odd number lines. Finally, the two values are averaged together to estimate p. To extract p, the ln (number of faults for x lines shorted) vs log([x−1]s+[x−2]w) is plotted. It can be shown that the slope of this line is −p. The Do term is extracted by counting the number of failures at each grouping of lines and dividing by the area of the structure. However, for very large Do, this estimate will be too optimistic. Additional information on extracing defect size distribution from structures similar to the test structures can be found, for example, in "Extraction of Defect Size Distribution in an IC Layer Using Test Structure Data", J. Khare, W. Maly and M. E. Thomas, IEEE Transactions on Semiconductor Manufacturing, pp. 354-368, Vol. 7, No. 3, August, 1994, which is incorporated by reference as if fully set forth herein.

As an example, consider the following data taken from 1 wafer of 100 dies:

| Number Lines Shorted | Number of Failures |
|---|---|
| 2 | 98 |
| 3 | 11 |
| 4 | 4 |
| 5 | 2 |
| 6 | 1 |
| 7 | 0 |
| 8 | 0 |

Figure 21:
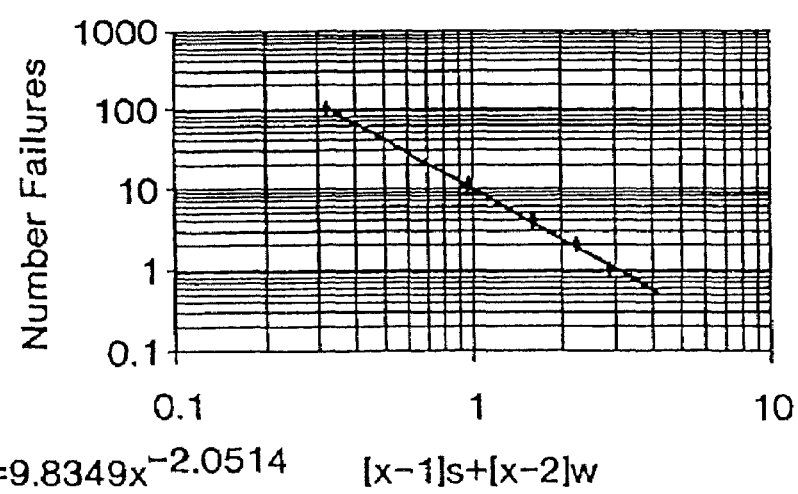
FIG. 21 depicts a plot for determining the rate at which defects decay over size.

If the structure size is 1 cm$^2$ then the Do would be 98+11+4+2+1=133/(100*1)=1.33 defects/cm$^2$. Also, the plot of log (number of failures) vs log([x−1]s+[x−2]w) (see FIG. 21) shows that p=2.05.

The Comb Structure Technique

Assuming a comb of width=space=s, it can be shown that the yield of this structure can be written as:

$$\ln[|\ln(Y)|] = \ln\left[-\int_{x_0}^{\infty} DSD(x) \times CA(x) dx\right] \propto (1-p) \times \ln(s)$$

Thus, from the slope of the plot of ln[|ln(Y)|] vs. ln(s), p can be estimated. The Do extraction technique is the same technique as mentioned above.

Yield Impact and Assessment

Once a sufficient number of characterization vehicles has been run and yield estimates are made for each characterization vehicle, the results are placed in a spread sheet to enable prioritization of yield activities. Tables XIV through XVI are examples of information contained in such a spread sheet. It has been divided into sections of metal yield, poly and active area (AA) yield (Table XIV), contact and via yield (Table XV), and device yield (Table XVI). The columns on the left indicate systematic yield loss mechanisms while the columns on the right indicate random yield loss mechanisms. Although the exact type of systematic failure mechanisms vary from product to product, and technology by technology, examples are shown in Tables XIV through XVI.

Usually, targets are ascribed to each module listed in the spread sheet. The further a module yield is away from a target, the more emphasis and resources are devoted to fixing the problem. For example, if the target was set artificially at 95 percent for each module in the example shown in Tables XIV through XVI, then clearly ($M_2 \to M_3$) vias (75.12%) followed by similar vias ($M_1 \to M_2$) (81.92%), $M_1$ shorts (82.25%), and contacts to poly (87.22%) are below target and, with vias ($M_2 \to M_3$) needing the most amount of work and contacts to poly needing the least amount of work.

Within each module, it is also possible to tell where the greatest yield loss is situated. That is, is it one particular systematic mechanism being the yield down or is it merely a random defectivity problem, or is it some combination of the two? For example, as shown in Table XV, via ($M_2 \to M_3$) yield loss is clearly dominated by a systematic problem affecting vias connected to long metal runners on the $M_3$ level (77.40%). Vias from ($M_1 \to M_2$) are affected by the same problems (91.52%) in addition to a random defectivity problem (92.49%). Solving vias ($M_1 \to M_2$) yield problems would require fixing both of these problems.

As shown in Table XIV, $M_1$ yield loss is also dominated by a random defectivity issue (85.23%) in addition to a systematic problem affecting wide lines near small spaces (96.66%). Fixing both of these problems would be required for improving Metal 1. Similar conclusions can be made for other modules in the spread sheet.

For the worst yielding modules, frequent running of further characterization vehicles for this module would be required. Usually, splits will be done on these characterization vehicles to try and improve and validate those improvements in module yield. For the modules which are within target, routine monitoring of short flow characterization vehicles would still be required to validate that there has been no down turn or other movement in module yield. However, these characterization vehicles can be run less frequently than for those modules with known problems.

TABLE XIV

| | | Systematic Yield Loss Mechanisms | | | Random Yield Loss Mechanism | | | |
|---|---|---|---|---|---|---|---|---|
| | | Shortable Area (cm$^2$) | Instant Count | Estimated Yield | Do | P | Estimated Yield | |
| | | Opens and Shorts (Metal Layers) | | | | | | |
| Metal-1 | Random Yield | | | | 0.7 defects/cm$^2$ | 2.3 | 85.23% | |
| | Wide lines near small space | 0.034 | | 96.66% | | | | |
| | Wide space near small lines | 0.00014 | | 99.99% | | | | |
| | Yield for OPC structures | | 72,341 | 99.86% | | | | |
| | Bent lines | | 492 | 100.00% | | | | |
| | Total for M1 | | | | | | 82.25% | |
| Metal-2 | Random Yield | | | | 0.35 defects/cm$^2$ | 1.92 | 97.45% | |
| | Wide lines near small space | 0.00079 | | 99.92% | | | | |
| | Wide space near small lines | 0.000042 | | 100.00% | | | | |
| | Yield for OPC structures | | 1040372 | 97.94% | | | | |
| | Bent lines | | 103 | 100.00% | | | | |
| | Total for M2 | | | | | | 95.36% | |
| Metal-3 | Random Yield | | | | 0.25 defects/cm$^2$ | 2.02 | 96.92% | |
| | Wide lines near small space | 0.0000034 | | 100.00% | | | | |
| | Wide space near small lines | 0 | | 100.00% | | | | |
| | Yield for OPC structures | | 352 | 100.00% | | | | |
| | Bent lines | | 7942 | 99.92% | | | | |
| | Total for M3 | | | | | | 96.84% | |
| | | Open and Shorts (Poly and AA Layer) | | | | | | |
| Poly | Random Yield (without silicide) | | | | 0.17 defects/cm$^2$ | 2.03 | 99.81% | |
| | Random Yield (with silicide) | | | | 4.34 defects/cm$^2$ | 4.56 | 89.54% | 89.71% from silicide |
| | Wide lines near small space | 0 | | 100.00% | | | | |
| | Wide space near small lines | 0.01203 | | 98.80% | | | | |
| | Yield for OPC structures | | 0 | 100.00% | | | | |
| | Bent lines | | 786541 | 92.44% | | | | |
| | Over wide AA | 0.034 | | 96.66% | | | | |
| | Over narrow AA | 0.101 | | 99.00% | | | | |
| | Total for Poly | | | | | | 87.22% | |
| AA | Random Yield (without silicide) | | | | 1.3 | 3.45 | 99.12% | |
| | Random Yield (with silicide) | | | | 1.7 | 3.02 | 98.72% | 99.60% from silicide |
| | Wide lines near small space | | 10952 | 99.96% | | | | |
| | Wide space near small lines | | 0 | 100.00% | | | | |
| | Total for AA | | | | | | 98.70 | |

TABLE XV

Contacts and Vias

| | | Systematic Yield Loss Mechanisms | | | Random Yield Loss Mechanism | | | |
|---|---|---|---|---|---|---|---|---|
| | | Shortable Area (cm^2) | Instant Count | Estimated Yield | Fault Rate | Number | Estimated Yield | |
| Contact to Poly | Random Yield (without silicide) | | | | 2.20E−09 | 3270432 | 99.28% | |
| | Random Yield (with silicide) | | | | 3.10E−09 | 3270432 | 98.99% | 99.71% |
| | Yield for Long Runners (on M1) | | 11,921 | 100.00% | | | | |
| | Yield for Long Runners (on Poly) | | 0 | 100.00% | | | | |
| | Yield for Redundant Vias | | 39421 | 100.00% | | | | |
| | Yield for very isolated contacts | | 7200 | 96.46% | | | | |
| | Total for Contact to Poly | | | | | | 94.80% | |
| Contact to n+ AA | Random Yield (without silicide) | | | | 2.20E−09 | 5270432 | 98.85% | |
| | Random Yield (with silicide) | | | | 3.10E−09 | 5270532 | 98.38% | 99.53% |
| | Yield for Long Runners (on M1) | | 75,324 | 99.99% | | | | |
| | Yield for Long Runners (on n + AA) | | 0 | 100.00% | | | | |
| | Yield for Redundant Vias | | 4032007 | 99.60% | | | | |
| | Yield for very isolated contacts | | 7200 | 99.93% | | | | |
| | Total for Contact to AA (n+) | | | | | | 96.78% | |
| Contact to p+ AA | Random Yield (without silicide) | | | | 2.20E−09 | 6093450 | 98.67% | |
| | Random Yield (with silicide) | | | | 3.10E−09 | 6093450 | 98.13% | |
| | Yield for Long Runners (on M1) | | 96,732 | 99.99% | | | | |
| | Yield for Long Runners (on p + AA) | | 0 | 100.00% | | | | |
| | Yield for Redundant Vias | | 39421 | 100.00% | | | | |
| | Yield for very isolated contacts | | 7200 | 99.93% | | | | |
| | Total for Contact to AA (p+) | | | | | | 96.74% | |
| Vias M1 −> M2 | Random Yield (single vias) | | | | 1.10E−08 | 7093210 | 92.49% | |
| | Yield for Long Runners (M2) | | 88640 | 91.52% | | | | |
| | Yield for Long Runners (M1) | | 97645 | 99.03% | | | | |
| | Yield for Redundant Vias | | 11003456 | 96.91% | | | | |
| | Yield for Isolated Vias | | 119582 | 96.81% | | | | |
| | Total for Via M1 − M2 | | | | | | 81.92% | |
| Vias M2 −> M3 | Random Yield (single vias) | | | | 3.10E−09 | 4002063 | 98.77% | |
| | Yield for Long Runners (M3) | | 256128 | 77.40% | | | | |
| | Yield for Long Runners (M2) | | 103432 | 96.97% | | | | |
| | Yield for Redundant Vias | | 7096230 | 99.29% | | | | |
| | Yield for Isolated Vias | | 1024 | 99.99% | | | | |
| | Total for Via M2 − M3 | | | | | | 75.12% | |

TABLE XVI

Devices

| | | Systematic Yield Loss Mechanisms | | | Random Yield Loss Mechanism | | |
|---|---|---|---|---|---|---|---|
| | | Shortable Area (cm^2) | Instant Count | Estimated Yield | Fault Rate | Number | Estimated Yield |
| NMOS | Random Yield (Logic Xtor) | | | | 2.90E−09 | 1395228 | 99.60% |
| | Random Yield (SRAM Xtor) | | | | 2.80E−09 | 2226720 | 99.38% |
| | S/D Shorts | | | | 1.00E−09 | 3621948 | 99.64% |
| | Bent Transistors | | 1113360 | 99.89% | | | |
| | Near Large AA | | 754000 | 99.92% | | | |
| | Near Small AA | | 1023452 | 99.90% | | | |
| | Total for NMOS Transistors | | | | | | 98.33% |
| PMOS | Random Yield (Logic Xtor) | | | | 1.80E−09 | 1491003 | 99.73% |
| | Random Yield (SRAM Xtor) | | | | 3.10E−09 | 1113360 | 99.66% |
| | S/D Shorts | | | | 9.00E.10 | 2604363 | 99.77% |
| | Bent Transistors | | 556680 | 99.94% | | | |
| | Near Large AA | | 789092 | 99.92% | | | |
| | Near Small AA | | 1309970 | 99.87% | | | |
| | Total for PMOS Transistors | | | | | | 98.89% |

The invention claimed is:

1. A computer-readable medium having a data structure stored thereon, said data structure including at least:

a metal-1 systematic yield component representing systematic defects associated with a first metal layer;

a metal-2 systematic yield component representing systematic defects associated with a second metal layer;

a poly systematic yield component representing systematic defects associated with a polysilicon layer;

a contact-to-poly systematic yield component representing systematic defects associated with contacts between the polysilicon layer and the first metal layer; and, a via M1-M2 systematic yield component representing systematic defects associated with vias between the first and second metal layers;

wherein said systematic yield components are used to estimate systematic yield losses associated with respective attributes of a proposed product layout.

2. The computer-readable medium of claim 1, wherein said data structure further includes at least:
 a metal-3 systematic yield component representing systematic defects associated with a third metal layer; and,
 a via M2-M3 systematic yield component representing systematic defects associated with vias between the second and third metal layers.

3. The computer-readable medium of claim 2, wherein:
 the contact-to-poly systematic yield component includes an instance-based fault rate for contacts between the polysilicon layer and the first metal layer;
 the via M1-M2 systematic yield component includes an instance-based fault rate for vias between the first and second metal layers; and,
 the via M2-M3 systematic yield component includes an instance-based fault rate for vias between the second and third metal layers.

4. The computer-readable medium of claim 1, wherein:
 the contact-to-poly systematic yield component includes an instance-based fault rate for contacts between the polysilicon layer and the first metal layer.

5. The computer-readable medium of claim 4, wherein:
 the via M1-M2 systematic yield component includes an instance-based fault rate for vias between the first and second metal layers.

6. The computer-readable medium of claim 1, wherein:
 the via M1-M2 systematic yield component includes an instance-based fault rate for vias between the first and second metal layers.

7. The computer-readable medium of claim 1, wherein said data structure further includes at least:
 a metal-1 random yield component representing random defects associated with the first metal layer;
 a metal-2 random yield component representing random defects associated with the second metal layer;
 a poly random yield component representing random defects associated with the polysilicon layer;
 a contact-to-poly random yield component representing random defects associated with contacts between the polysilicon layer and the first metal layer; and,
 a via M1-M2 random yield component representing random defects associated with vias between the first and second metal layers;
 wherein said random yield components are used to estimate random yield losses associated with respective attributes of the proposed product layout.

8. The computer-readable medium of claim 7, wherein said data structure further includes at least:
 a metal-3 systematic yield component representing systematic defects associated with a third metal layer;
 a via M2-M3 systematic yield component representing systematic defects associated with vias between the second and third metal layers;
 a metal-3 random yield component representing random defects associated with the third metal layer; and,
 a via M2-M3 random yield component representing random defects associated with vias between the second and third metal layers.

9. A method for estimating yield losses associated with manufacturing a proposed product layout in a particular manufacturing process, said method comprising at least the following acts:
 estimating, using a computer, systematic yield losses associated with a first metal layer by combining at least (i) a metal-1 systematic yield component representing systematic defects associated with a said first metal layer of the manufacturing process and (ii) a layout attribute related to a corresponding first metal layer of the proposed product layout to estimate systematic yield losses associated with said first metal layer;
 estimating systematic yield losses associated with a second metal layer by combining at least (i) a metal-2 systematic yield component representing systematic defects associated with said second metal layer of the manufacturing process and (ii) a layout attribute related to a corresponding second metal layer of the proposed product layout to estimate systematic yield losses associated with said second metal layer;
 estimating systematic yield losses associated with a polysilicon layer by combining at least (i) a poly systematic yield component representing systematic defects associated with a said polysilicon layer of the manufacturing process and (ii) a layout attribute related to a corresponding polysilicon layer of the proposed product layout to estimate systematic yield losses associated with said polysilicon layer;
 estimating systematic yield losses associated with contacts between the polysilicon layer and the first metal layer by combining at least (i) a contact-to-poly systematic yield component representing systematic defects associated with contacts between the polysilicon layer and the first metal layer of the manufacturing process and (ii) a layout attribute related to corresponding contacts between the polysilicon layer and the first metal layer of the proposed product layout to estimate systematic yield losses associated with said contacts; and,
 estimating systematic yield losses associated with vias between the first and second metal layers by combining at least (i) a via M1-M2 systematic yield component representing systematic defects associated with vias between the first and second metal layers of the manufacturing process and (ii) a layout attribute related to corresponding vias between the first and second metal layers of the proposed product layout to estimate systematic yield losses associated with said vias.

10. The method of claim 9, further comprising at least the following acts:
 estimating systematic yield losses associated with a third metal layer by combining at least (i) a metal-3 systematic yield component representing systematic defects associated with said third metal layer of the manufacturing process and (ii) a layout attribute related to a corresponding third metal layer of the proposed product layout to estimate systematic yield losses associated with said third metal layer;
 estimating systematic yield losses associated with vias between the second and third metal layers by combining at least (i) a via M2-M3 systematic yield component representing systematic defects associated with vias between the second and third metal layers of the manufacturing process and (ii) a layout attribute related to corresponding vias between the second and third metal layers of the proposed product layout to estimate systematic yield losses associated with said vias.

11. The method of claim 9, further comprising at least the following acts:
 estimating random yield losses associated with the first metal layer by combining at least (i) a metal-1 random yield component representing random defects associated with the first metal layer of the manufacturing process and (ii) a layout attribute related to the corresponding first metal layer of the proposed product layout to estimate random yield losses associated with said first metal layer; and, estimating random yield losses associated with the second metal layer by combining at least (i) a metal-2 random yield component representing random defects associated with the second metal layer of the manufacturing process and (ii) a layout attribute related to the corresponding second metal layer of the proposed product layout to estimate random yield losses associated with said second metal layer.

12. The method of claim 11, further comprising at least the following act:

estimating random yield losses associated with the polysilicon layer by combining at least (i) a poly random yield component representing random defects associated with the polysilicon layer of the manufacturing process and (ii) a layout attribute related to the corresponding polysilicon layer of the proposed product layout to estimate systematic yield losses associated with said polysilicon layer.

13. The method of claim 12, further comprising at least the following acts:

estimating random yield losses associated with contacts between the polysilicon layer and the first metal layer by combining at least (i) a contact-to-poly random yield component representing random defects associated with contacts between the polysilicon layer and the first metal layer of the manufacturing process and (ii) a layout attribute related to the corresponding contacts between the polysilicon layer and the first metal layer of the proposed product layout to estimate random yield losses associated with said contacts; and, estimating random yield losses associated with vias between the first and second metal layers by combining at least (i) a via M1-M2 random yield component representing random defects associated with vias between the first and second metal layers of the manufacturing process and (ii) a layout attribute related to the corresponding vias between first and second metal layers of the proposed product layout to estimate random yield losses associated with said vias.

14. The method of claim 13, further comprising at least the following acts:

estimating random yield losses associated with the third metal layer by combining at least (i) a metal-3 random yield component representing random defects associated with the third metal layer of the manufacturing process and (ii) a layout attribute related to the corresponding third metal layer of the proposed product layout to estimate random yield losses associated with said third metal layer; and, estimating random yield losses associated with vias between the second and third metal layers by combining at least (i) a via M2-M3 random yield component representing random defects associated with vias between the second and third metal layers of the manufacturing process and (ii) a layout attribute related to the corresponding vias between second and third metal layers of the proposed product layout to estimate random yield losses associated with said vias.

15. A computer-readable medium having a data structure stored thereon for storing a computer-generated yield impact report for a proposed product layout, said computer-generated report comprising at least the following:

a computer-generated estimate of systematic yield losses associated with a first metal layer of the proposed product layout;

a computer-generated estimate of systematic yield losses associated with a second metal layer of the proposed product layout;

a computer-generated estimate of systematic yield losses associated with a polysilicon layer of the proposed product layout;

a computer-generated estimate of systematic yield losses associated with contacts between the polysilicon layer and the first metal layer in the proposed product layout; and, a computer-generated estimate of systematic yield losses associated with vias between the first and second metal layers in proposed product layout.

16. The computer-readable medium of claim 15, wherein said computer-generated report further includes at least the following:

a computer-generated estimate of random yield losses associated with the first metal layer of the proposed product layout.

17. The computer-readable medium of claim 16, wherein said computer-generated report further includes at least the following:

a computer-generated estimate of random yield losses associated with the second metal layer of the proposed product layout.

18. The computer-readable medium of claim 16, wherein said computer-generated report further includes at least the following:

a computer-generated estimate of random yield losses associated with the polysilicon layer of the proposed product layout.

19. The computer-readable medium of claim 18, wherein said computer-generated report further includes at least the following:

a computer-generated estimate of random yield losses associated with contacts between the polysilicon layer and the first metal layer in the proposed product layout.

20. The computer-readable medium of claim 19, wherein said computer-generated report further includes at least the following:

a computer-generated estimate of random yield losses associated with vias between the first and second metal layers in the proposed product layout.

* * * * *